United States Patent
Hayashi et al.

[11] Patent Number: 6,143,116
[45] Date of Patent: Nov. 7, 2000

[54] PROCESS FOR PRODUCING A MULTI-LAYER WIRING BOARD

[75] Inventors: Katsura Hayashi; Akihiko Nishimoto; Yukihiro Hiramatsu; Yuji Iino; Shuichi Tateno; Riichi Sasamori; Shigeaki Fukumoto, all of Kokubu, Japan

[73] Assignee: Kyocera Corporation, Kyoto, Japan

[21] Appl. No.: 08/937,529

[22] Filed: Sep. 25, 1997

[30] Foreign Application Priority Data

| | | | |
|---|---|---|---|
| Sep. 26, 1996 | [JP] | Japan | 8-254492 |
| Dec. 18, 1996 | [JP] | Japan | 8-338688 |
| Dec. 27, 1996 | [JP] | Japan | 8-350069 |
| May 27, 1997 | [JP] | Japan | 9-137129 |
| May 27, 1997 | [JP] | Japan | 9-137130 |
| May 30, 1997 | [JP] | Japan | 9-141759 |
| Jul. 31, 1997 | [JP] | Japan | 9-206038 |

[51] Int. Cl.[7] .......... B32B 31/12; B32B 31/20; B32B 31/24; H05K 3/02

[52] U.S. Cl. .......... 156/233; 156/235; 156/252; 156/272.2; 156/273.9; 29/830; 29/846

[58] Field of Search .......... 156/233, 235, 156/252, 253, 272.2, 273.9; 29/830, 846, 852; 427/96, 97; 174/250, 262; 428/901

[56] References Cited

U.S. PATENT DOCUMENTS

| | | |
|---|---|---|
| 2,692,190 | 10/1954 | Pritikin . |
| 2,969,300 | 1/1961 | Franz . |
| 4,751,126 | 6/1988 | Oodaira et al. . |
| 4,869,767 | 9/1989 | Robinson et al. .......... 156/233 |
| 4,889,584 | 12/1989 | Wada et al. . |
| 4,912,020 | 3/1990 | King et al. .......... 156/233 X |
| 5,309,629 | 5/1994 | Traskos et al. .......... 428/901 X |
| 5,744,758 | 4/1998 | Takenouchi et al. .......... 428/901 X |
| 5,746,868 | 5/1998 | Abe .......... 156/253 X |
| 5,817,404 | 10/1998 | Kawakita et al. .......... 428/901 X |
| 5,848,466 | 12/1998 | Viza et al. . |
| 5,925,930 | 7/1999 | Farnworth et al. . |

*Primary Examiner*—Curtis Mayes
*Attorney, Agent, or Firm*—Hogan & Hartson, LLP

[57] ABSTRACT

A multilayer wiring board formed by laminating a plurality of circuit board units each including an insulating board containing at least a thermosetting resin, and a wiring circuit layer formed on the surface of said insulating board, wherein said insulating board is provided with via hole conducting passages so as to electrically connect the wiring circuit layers of the neighboring circuit board units, said via hole conducting passages are formed by filling via holes formed in the insulating board with a conducting paste, and said wiring circuit layer is buried in the surface of the insulating board in a manner that said insulating board possesses a flat surface. The multilayer wiring board has a satisfactory flatness required for mounting flip chips. Besides, the insulating board and the via hole conducting passages are not infiltrated by chemicals such as etching solution or plating solution. There is no problem of defective circuit, and connection is highly reliably maintained offering advantage in realizing a highly dense wiring.

8 Claims, 5 Drawing Sheets

PROCESS FOR PRODUCING A MULTI-LAYER WIRING BOARD

BACKGROUND OF THE INVENTION 1. (Field of the Invention)

The present invention relates to a multilayer wiring board and, particularly, to a multilayer wiring board adapted to packages for containing semiconductor elements, and to a process for producing the same.

2. (Description of the Prior Art)

A ceramic multilayer wiring board capable of forming wirings at a relatively high density has heretofore been used for packaging semiconductor elements. The ceramic multilayer wiring board is formed of an insulating board such as alumina and a wiring conductor composed of a high-melting metal such as tungsten or molybdenum formed on the surface thereof. Cavities are formed in portions of the insulating board, and semiconductor elements are held in the cavities which are hermetically sealed by a closure member.

Such a ceramic multilayer wiring board is hard and brittle, and is subject to be broken or cracked during the step of production or the step of conveyance, and loses hermetic sealing for the semiconductor elements, resulting in a decrease in the yields of the final products. The board is produced by printing a metallizing ink onto a green sheet, and laminating many printed sheets followed by sintering accompanied, however, by a problem of shrinking due to firing at a high temperature in the step of sintering. In other words, the obtained board is deformed such as being warped and undergoes dimensional variation, and is not capable of sufficiently meeting strict requirements such as very high density of wiring, flatness required for the boards, such as flip chip, etc.

Recently, therefore, there has been proposed a multilayer wiring board of a resin obtained by adhering a copper foil onto the surface of an insulating board made of an organic resin, forming a fine wiring circuit layer on the insulating board by etching the copper foil, and laminating such an insulating board having such a wiring circuit layer one upon the other. Such a resin board is free from such defects as breakage or cracking inherent in the ceramic board. Even when laminated, furthermore, the above resin board does not require heat treatment at a high temperature like that of firing. To increase the strength of the resin board, furthermore, there has been proposed an insulating board obtained by dispersing a spherical or fibrous inorganic filler in an organic resin. Study has further been conducted to adapt the insulating substrate to a multi-chip module (MCM) which mounts many semiconductor elements.

With the above-mentioned resin board in which protruded portions are formed by a wiring circuit layer on the insulating board, however, flatness is low and fails to satisfy the requirements for mounting the flip chips. Moreover, use of the etching solution and plating solution for forming the wiring circuit layer deteriorate the characteristics of the insulating board.

Furthermore, the conventional multilayer wiring board made of a resin must be improved from the standpoint of accomplishing fineness and high density. That is, it is widely accepted practice to form through-holes penetrating through the board and to connect the wiring circuit layers by plating the interior of the through-holes. Here, however, the through-holes impose limitation on the circuit design making it difficult to accomplish high-density wiring. There has further been developed a so-called build-up method according to which an insulating layer is formed by applying an insulating slurry and a wiring circuit layer is formed by plating alternatingly on the surface of the board and, at the same time, via holes are formed in the insulating layers to obtain a laminate of many layers. Even with the build-up method, however, limitation is imposed on arranging the via holes, making it difficult to accomplish high-density wiring. Furthermore, the number of times the insulating layers are immersed in the etching solution and in the plating solution increases with an increase in the number of the layers laminated on the board to accomplish the wiring circuit of a high density. Therefore, a problem remains in that the insulating layer absorbs these chemical solutions and is degraded. Thus, it is difficult to accomplish the high-density wiring even relying upon the build-up method.

In recent years, therefore, it has been proposed to form via hole conducting passages by filling the via holes with a conducting paste. This method makes it possible to form via hole conducting passages at any place and is drawing attention as technology which is indispensable for forming high-density wiring.

When the via hole conducting passages are formed by filling the via holes with the conducting paste, however, there develops a defect in that the circuit becomes defective. That is, the conducting paste is obtained by dispersing a metal powder in the resin binder. Therefore, the via hole conducting passages formed as described above contain voids in large amounts between the metal particles. When a wiring circuit layer that is electrically connected to the via hole conducting passages is formed by intimately adhering a metal foil to the via hole conducting passages formed in the insulating layer, by applying a resist, by effecting the etching, and by peeling off the resist, however, the etching solution and the resist-removing solution enter into the voids in the via hole conducting passages and cause the circuit to become defective.

SUMMARY OF THE INVENTION

It is therefore an object of the present invention to provide a multilayer wiring board which effectively prevents the characteristics of the insulating layer and the via hole conducting passages from being deteriorated by the chemical solutions such as etching solution and plating solution, which is adapted to forming a wiring circuit very finely and highly densely, providing flatness that satisfies the requirements for mounting the flip chips, as well as to provide a process for producing the same.

According to the present invention, there is provided a multilayer wiring board formed by laminating a plurality of circuit board units each including an insulating board containing at least a thermosetting resin, and a wiring circuit layer formed on the surface of said insulating board, wherein:

said insulating board is provided with via hole conducting passages so as to electrically connect the wiring circuit layers of the neighboring circuit board units;

said via hole conducting passages are formed by filling via holes formed in the insulating board with a conducting paste; and said wiring circuit layer is buried in the surface of the insulating board in a manner that said insulating board possesses a flat surface.

According to the present invention, furthermore, there is provided a process for producing a multi-layer wiring board comprising:

(a) a step for forming a first wiring circuit layer on one surface of a first insulating board;

(b) a step for forming via hole conducting passages in a soft second insulating board containing a thermosetting resin by forming via holes, and filling said via holes with a conducting paste;

(c) a step for forming a second wiring circuit layer buried in one surface of the second insulating board by transferring a conducting layer of a metal foil formed on a transfer sheet in a manner to close the open portions on one side of said via hole conducting passages formed in the surface of the second insulating board;

(d) a step for laminating the second insulating board obtained in said step (c) on the surface of the first insulating board on the side of forming a wiring circuit layer in a manner that the open portions on the other side of said via hole conducting passages formed in the second insulating board are closed by the first wiring circuit layer; and (e) a step for forming a multiplicity of layers by repetitively effecting the operations of the above-mentioned steps (b) to (d) for the second insulating board in which the second wiring circuit layer is formed and which is laminated on the first insulating board.

According to the present invention, there is further provided a process for producing a multilayer wiring board, comprising:

(A) a step for forming a first wiring circuit layer on a first insulating board;

(B) a step for laminating, on said first wiring circuit layer, a second soft insulating board having via hole conducting passages formed by filling via holes with a conducting paste;

(C) a step for forming a second wiring circuit layer buried in the surface of the second insulating board by transferring a conducting layer of a metal foil formed on a transfer sheet in a manner to close the open portions of said via hole conducting passages; and (D) a step for forming a multiplicity of layers by repetitively effecting the operations of the above-mentioned steps (B) and (C) for the second insulating board in which the second wiring circuit layer is formed and which is laminated on the first insulating board.

The multilayer wiring board of the present invention has the wiring circuit layer that is buried in the surface of the insulating board. Therefore, the insulating board has a flat surface to sufficiently satisfy the requirements for mounting the flip chips.

Moreover, the wiring circuit layer is formed by pressadhering a conducting layer of a metal foil formed on a transfer sheet onto the insulating board. Therefore, the insulating board is not immersed in the chemical solutions such as etching solution or plating solution, and a drop of properties due to the chemical solutions is effectively avoided. The via hole conducting passages for connecting the wiring circuit layers are formed by filling the via holes with a conducting paste; i.e., the conducting passages can be formed at any position, offering great advantage for realizing a highly dense wiring, without permitting the chemical solutions to infiltrate into the conducting passages and effectively avoiding the problem of defective circuit.

DETAILED DESCRIPTION OF THE INVENTION (Structure of the Multilayer Wiring Board)

Figure 1:
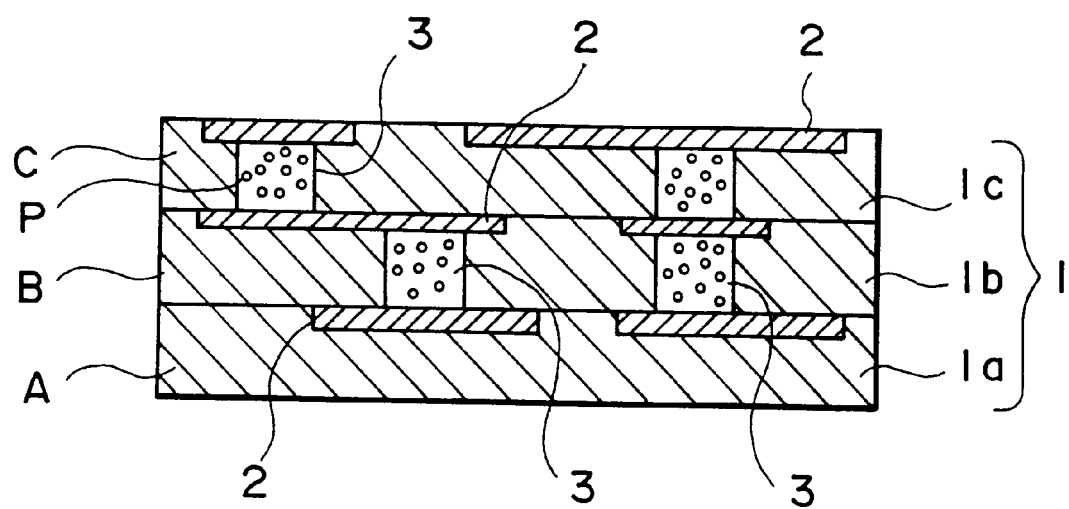
FIG. 1 is a diagram schematically illustrating the structure of a multilayer wiring board according to the present invention.

Referring to FIG. 1, a multilayer wiring board of the present invention has a structure in which a plurality of circuit board units A, B and C are laminated one upon the other, the circuit board units A, B and C each having an insulating board 1, and wiring circuit layers 2 formed on the surfaces of the insulating board 1. The wiring circuit layers 2 of the circuit board units A, B and C are electrically connected together through many via hole conducting passages 3 formed in the insulating board 1. Both ends of each via hole conducting passage 3 are sealed with the wiring circuit layers 2. In an example of FIG. 1, no via hole conducting passage 3 is formed in the insulating board 1a of the circuit board unit A of the lowermost layer. As required, however, the via hole conducting passage 3 may be formed in the insulating board 1a of the lowermost layer to accomplish electric conduction from the bottom surface of the insulating board 1a to an external circuit board such as mother board. A wiring circuit layer can be formed on the bottom surface of the insulating board 1a of the lowermost layer.

The via hole conducting passage 3 is formed by filling a via hole formed in the insulating board 1 with a conducting paste in which a metal powder has been dispersed. Therefore, the via hole conducting passage 3 can be formed at any place, and no limitation is imposed by the position of the via hole conducting passage 3 upon the shape and position of the wiring circuit layer 2.

As shown, furthermore, the wiring circuit layer 2 is buried in the surface of the insulating board 1; i.e., the insulating board 1 has a flat surface. It will therefore be obvious that the multi-layer wiring board of the present invention has no gap among the insulating boards 1 that are laminated, and the uppermost insulating board 1c has a flat surface, too. Accordingly, the multilayer wiring board has a flatness which is very adapted to mounting flip chips.

As will be described later, furthermore, the wiring circuit layer 2 is formed by transferring a conducting layer formed on the surface of a transfer sheet onto the surface of the insulating board 1. Therefore, the insulating board 1 is not immersed in the etching solution or in the resist solution that is used for forming a conducting layer on the surface of the transfer sheet, and a drop of properties of the insulating board 1 due to chemical solutions is effectively avoided. There is no probability that these chemical solutions infiltrate into the via hole conducting passages 3, and the circuit is effectively prevented from becoming defective due to these chemical solutions. Besides, both ends of the via hole conducting passages 3 have been sealed with the wiring circuit layers 2. Therefore, even when a plated layer such as of nickel or solder is formed on the surfaces of the multilayer wiring boards, the via hole conducting passages 3 are effectively prevented from becoming defective due to the plating solution or the like solution.

Insulating Board 1:

According to the present invention, the insulating board 1 is made of an insulating material containing at least a thermosetting resin. Examples of the thermosetting resin include polyphenylene ether (PPE), bismaleimide triazine resin (BT resin), epoxy resin, polyimide resin, fluorine-contained resin, phenol resin and aramid resin. As a starting material, in particular, it is desired to use a thermosetting resin which is a liquid at room temperature.

From the standpoint of increasing the strength, furthermore, it is desired that the insulating material further contains an inorganic filler or an organic filler together with the thermosetting resin. Examples of the inorganic filler are generally silica ($SiO_2$), alumina ($Al_2O_3$), zirconium oxide ($ZrO_2$), titanium oxide ($TiO_2$), zeolite, aluminum nitride (AlN), silicon carbide (SiC), barium titanate ($BaTiO_3$), strontium titanate ($SrTiO_3$), calcium titanate ($CaTiO_3$), E-glass and aluminum borate. It is desired that they have an average particle diameter of not larger than 20 $\mu$m and, particularly, not larger than 10 $\mu$m and, most particularly, not larger than 7 $\mu$m, and they have spherical shape. It is further allowed to use a fibrous material having an aspect ratio of not smaller than 2 and, particularly, not smaller than 5, such as glass fiber, paper, glass woven fabric, glass nonwoven fabric, or needle-like fillers such as aluminum borate whisker, potassium titanate whisker, etc. As the organic filler, furthermore, it is allowed to use an aramid resin and, particularly, a woven or nonwoven fabric of aramid resin.

The insulating board containing the above-mentioned filler and, particularly, the woven or nonwoven fabric of aramid resin, makes it easy to carry out the perforation operation and enables fine via holes to be easily formed by laser machining. The aramid resin, however, is highly hygroscopic. That is, the epoxy resin, BT resin or PPE that is usually used for the wiring board has a moisture-absorbing amount of from about 0.1 to 0.2%. However, the moisture-absorbing amount of the aramid resin is ten or more times as great, i.e., 2 to 3%. Therefore, the wiring board containing the aramid resin becomes brittle as it undergoes expansion upon absorbing moisture, and cannot be used for extended periods of time. This tendency becomes conspicuous particularly when the wiring board is used in a high-temperature and high-humidity atmosphere.

In the present invention, therefore, it is desired that only the insulating board 1b (hereinafter often called inner insulating board) constituting the circuit board unit that is not facing the outer side contains the aramid resin as a filler, and that the aramid resin is not contained in the insulating boards 1a and 1c (hereinafter often called outer insulating boards) of the circuit board unit facing the outer side. That is, the outer insulating boards 1a and 1c having resistance against the moisture are used to protect the inner hygroscopic insulating board 1b containing aramid resin, in order to utilize the advantage of the aramid resin which is a filler to a maximum degree. In the example of FIG. 1, there is only one inner insulating board as denoted by 1b. When a multiplicity of layers are formed, the number of the inner insulating boards increases, as a matter of course.

It is desired that the outer insulating boards 1a and 1c without containing aramid resin contains the above-mentioned thermosetting resin and inorganic filler at a volume ratio of from 15:85 to 95:5 and, particularly, from 15:85 to 50:50. By suitably adjusting the blending amount of the inorganic filler, it is desired that the coefficient of thermal expansion is set to be not larger than 30 ppm/° C. and, particularly, not larger than 20 ppm/° C. over a temperature range of from room temperature (20° C.) to 150° C., and the difference from the coefficient of thermal expansion of the inner insulating board 1b over the same temperature range is set to be not larger than 10 ppm/° C., particularly, not larger than 8 ppm/° C. and, most preferably, not larger than 6 ppm/° C. That is, the aramid resin has a very small coefficient of thermal expansion over the above-mentioned temperature range, and the coefficient of thermal expansion of the inner insulating board 1b containing the aramid resin becomes smaller than 10 ppm/° C. On the other hand, most of the above-mentioned thermosetting resins have coefficients of thermal expansion which are as very large as 50 to 60 ppm/° C. As the difference in the coefficient of thermal expansion increases between the outer insulating boards 1a, 1c and the inner insulating board 1b, therefore, the outer insulating boards 1a and 1c peel off when the multilayer wiring substrate is subjected to the heat cycles. It is therefore desired to adjust the blending amount of the inorganic filler, so that-the coefficient of thermal expansion of the outer insulating boards 1a and 1c lies within the above-mentioned range, in order to minimize the difference in the coefficient of thermal expansion from the inner insulating board 1b.

It is further desired that the outer insulating boards 1a and 1c have thicknesses of from 10 to 300 $\mu$m and, particularly, from 40 to 100 $\mu$m from the standpoint of obtaining favorable moisture-proof property.

In the inner insulating board 1b, it is desired that the aramid resin as a filler is contained at a ratio of 30 to 70% by volume from the standpoint of favorably forming via holes. The aramid resin is used in the form of a woven fabric or a nonwoven fabric.

In the present invention, furthermore, it is allowed to use the inner insulating board 1b having an increased strength. For example, the inner insulating board 1b may have a strength of not smaller than 150 MPa and, particularly, not smaller than 300 MPa to increase the strength of the whole multilayer wiring board. This is particularly advantageous for thin boards, wiring boards used for small information devices, and for small wiring boards of the type of memory card. That is, the strength of the multilayer wiring boards as a whole increases with an increase in the strength of all insulating boards in the multilayer wiring board. In this case, however, the insulating property of the multilayer wiring board is lost or mismatching occurs between the wiring circuit layer and the via hole conducting passages due to a difference in the thermal expansion. This problem, however, can be avoided by increasing the strength of the inner insulating board 1b only. The strength is measured by using a test piece measuring 0.5×3×15 mm based upon a three-point flexural strength testing of a span of 10 mm.

The inner insulating board 1b having a high strength is realized by containing the inorganic filler in the inner insulating board 1b in an amount larger than that of the outer insulating boards 1a and 1c, or by using a filler having a particularly high strength-improving property. As the filler having a high strength-improving property, there can be exemplified fibrous or needle-like ones, such as glass fiber, aluminum borate whisker, woven glass fabric, nonwoven glass fabric, woven aramid fabric, nonwoven aramid fabric and potassium titanate whisker among the above-mentioned examples. Among them, the woven glass fabric, nonwoven glass fabric, woven aramid fabric and nonwoven aramid fabric are most effective. In particular, the woven aramid fabric and nonwoven aramid fabric are desired from the standpoint of forming via holes as described earlier. In this case, it is just desired to decrease the difference in the coefficient of thermal expansion from the outer insulating boards 1a, 1c.

The inner insulating board 1b having a high strength needs be present in a number of at least one in the multilayer wiring board, and should, particularly, be formed in the center of the multilayer wiring board.

Wiring Circuit Layer 2:

As a conductor for constituting a wiring circuit layer 2, there can be preferably used a low-resistance metal, such as gold, silver, copper, aluminum, or an alloy thereof. Particularly preferred examples are copper or an alloy containing copper. To adjust the resistance of the circuit, there can be used an alloy containing a high-resistance metal, such as Ni—Cr alloy.

The thickness of the wiring circuit layer 2 differs depending upon the thickness of the insulating board 1, but is usually from 1 to 100 $\mu$m and, particularly, from 5 to 50 $\mu$m. When this thickness is smaller than the above-mentioned range, the resistivity of the circuit becomes too large, which is not desirable. When the thickness is larger than the above-mentioned range, on the other hand, the amount increases for burying the circuit in the insulating board 1, causing the insulating board 1 to be deformed at the time of burying the circuit or laminating the circuit board unit, which is not desirable; either. Besides, it becomes difficult to effect the etching, making it difficult to form a fine circuit. From the standpoint of sealing both ends of the via hole conducting passages 3, in particular, it is desired that the wiring circuit layer 2 has a thickness of from 5 to 40 $\mu$m and that the wiring circuit is formed of a metal foil having such a thickness.

Via Hole Conducting Passages 3:

The via hole conducting passages 3 are formed by filling via holes formed in the insulating board 1 with a conducting paste. It is desired that the via hole conducting passages 3 have a resistivity of not larger than $3.1\times10^5$ $\Omega$-cm and, particularly, not larger than $1\times10^{-5}$ $\Omega$-cm. According to the method of plating the holes, in general, it is allowed to form a conducting passage of a low resistance. According to a method of filling the holes with a conducting paste, it is difficult to completely remove the resin components from the paste and, besides, oxides exist on the surfaces of the metal powder, making it difficult to form conducting passages of a low resistance. According to a conventional method, for example, the via hole conducting passages have a resistivity of about $7\times10^{-4}$ $\Omega$-cm at the smallest. According to the present invention, however, it is made possible to form via hole conducting passages having a small resistance as described above even relying upon the method of filling the via holes with a conducting paste.

The above-mentioned multilayer wiring board can be formed by various methods of production. Described below is the most desired example of production with reference to the accompanying drawings.

(Production 1 of Multilayer Wiring Board)

Figure 2A:
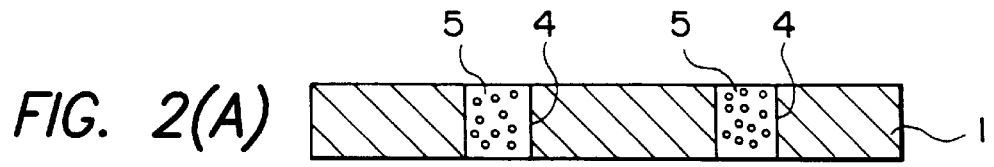
FIGS. 2(A)–2(D) is a diagram illustrating a process for producing the multilayer wiring board according to the present invention.
Figure 2B:
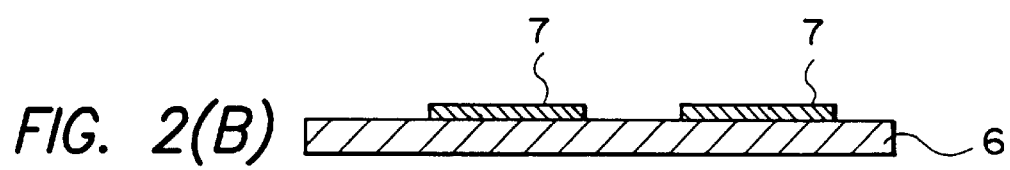
Figure 2C:
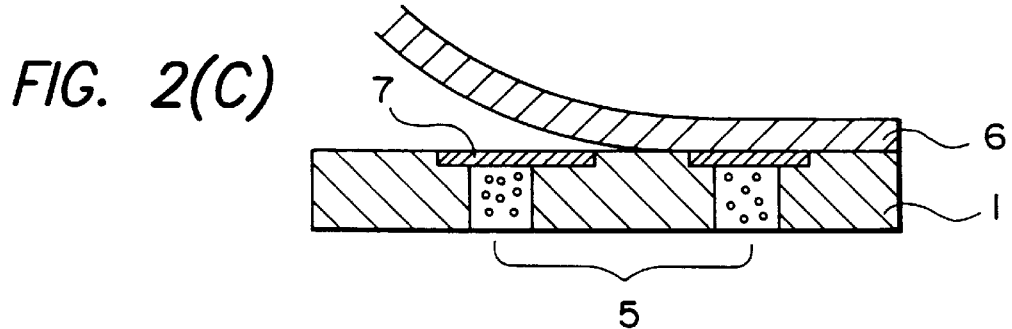

A process for producing the multilayer wiring board of FIG. 1 will now be described with reference to FIG. 2, wherein the steps of FIGS. 2(A) to 2(C) are for producing the circuit board unit B in the multilayer wiring board of FIG. 1.

Forming the Via Hole Conducting Passages:

Referring to FIG. 2(A), first, via holes 4 are formed in the insulating board 1 that has been formed according to a predetermined method.

The insulating board 1 may have a composition that differs depending upon the object as mentioned earlier. In this step, however, the thermosetting resin constituting the insulating board 1 is in a half-cured state and permits a needle having an end curvature of 200 $\mu$m to infiltrate by 5 $\mu$m under a load of 100 g. By using the half-cured insulating board 1, a conducting layer (corresponds to the wiring circuit layer 2) that is transferred when the transfer sheet is press-adhered is buried in the insulating board 1 in the step of transfer that will be described later, enabling the surface to become flat. It is further made possible to effectively decrease the resistance of the via hole conducting passage that will be described later and to press-adhere the obtained circuit board units to laminate them one upon the other. Such an insulating board 1 is a pre-preg or a soft insulating sheet composed of the above-mentioned thermosetting resin or the thermosetting resin and the filler. The soft insulating sheet is obtained by, for example, mixing a solvent such as toluene, butyl acetate, methyl ethyl ketone, isopropyl alcohol or ethanol into the thermosetting resin or into a mixture of the thermosetting resin and the filler to obtain an insulating slurry having a viscosity (25° C.) of about 100 to 3000 poises, which is then formed into a sheet using a doctor blade or the like, followed by heating to half-cure it.

The via holes 4 can be easily formed by drilling, punching, sand-blasting or by a laser machining such as carbon dioxide gas laser, YAG laser or excimer laser. The via holes 4 are filled with a conducting paste 5 containing a metal powder to thereby form via hole conducting passages. When there is no need to form via hole conducting passages 3 like in the lowermost insulating board 1a of the multilayer wiring board of FIG. 1, no via hole 4 is formed, and a wiring circuit layer is formed on the insulating board 1 according to the procedures shown in FIGS. 2(B) and 2(C) that will be described later.

The conducting paste 5 comprises a metal powder, a resin component and a solvent. After the via holes 4 are filled with the conducting paste 5, the solvent and the resin component are removed by heat-drying at a temperature of not higher than 140° C. to form via hole conducting passages. There is no particular limitation on the solvent provided it is capable of dissolving or dispersing the resin component. Usually, however, isopropyl alcohol, terpineol, 2-octanol or butylcarbitol acetate (BCA) is preferably used. To form via hole conducting passages of a small resistance, furthermore, the metal powder contained in the conducting paste 5 is a low-resistance metal powder such as copper powder, silver powder, silver-coated copper powder, or a copper-silver alloy powder. From the standpoint of resistance against migration, in particular, it is desired to use a copper powder coated with silver at a ratio of 1 to 30% by weight or a silver-copper alloy powder containing silver in an amount of 1 to 50% by weight. It is further desired that the metal powder has an average particle diameter of from 0.5 to 50 $\mu$m, preferably, from 3 to 10 $\mu$m, more preferably, from 3 to 7 $\mu$m, and most preferably, from 3 to 5 $\mu$m. When a metal powder having an average particle diameter smaller than the above-mentioned range is used, the contact resistance becomes high among the metal particles making it difficult to decrease the resistance. When a metal powder having an average particle diameter larger than the above-mentioned range is used, furthermore, the contact is not sufficient among the metal particles, making it difficult to decrease the resistance.

According to the present invention, furthermore, it is allowable to use a cellulose-type resin or a glycol-type resin such as polyethylene glycol as a resin component in the conducting paste. It is particularly desired to use a thermosetting resin. This is to cure the thermosetting resin in the conducting paste 5 in a step that will be described later, to cure and contract the thermosetting resin, to contract the volume of the conducting paste 5 so that the metal powder comes into intimate contact therein, thereby to decrease the resistance of the via hole conducting passages. It is therefore desired to select the thermosetting resin having a large contraction factor upon curing. Concretely, it is desired to use a bisphenol A-type epoxy resin, bisphenol F-type epoxy resin, novolak-type epoxy resin, imide resin, alicyclic epoxy resin, amine-type epoxy resin, or epoxy resin esterified with glycidyl or cellulose. It is, further desired that the thermosetting resin is contained in an amount of from 5 to 40% by volume and, particularly, from 10 to 30% by volume in the conducting paste 5.

Preparation of a Transfer Sheet:

Referring to FIG. 2(B), on the surface of a predetermined transfer sheet 6 is formed a conducting layer 7 corresponding to the wiring circuit layer that is formed on the surface of the insulating board 1. The conducting layer 7 can be formed by a known resist method. For example, a metal foil is adhered onto the surface of the transfer sheet 6 in a manner that it can be peeled off, a resist is applied onto the surface of the metal foil according to a circuit pattern, the metal foil is removed from the portions other than the circuit pattern by etching and, then, the resist is removed to form the conducting layer 7.

It is desired that the metal foil used for forming the conducting layer 7 has an average surface roughness (Rz) of not smaller than 0.1 $\mu$m, particularly, from 0.3 to 3 $\mu$m and, most desirably, from 0.3 to 1.5 $\mu$m. By using the metal foil having such a surface coarseness, the conducting layer 7 that is transferred firmly bites into the surface of the insulating board 1, contributing to enhancing the intimate adhesion between the wiring circuit layer and the insulating board. In the same sense, it is desired that the surface of the insulating board 1 onto which the conducting layer 7 will be transferred has been coarsened to lie within the above-mentioned range. To adhere the metal foil to the transfer sheet 6, furthermore, it is allowable to use, as required, a well-known tackifier. For example, there can be favorably used a tackifier which loses tackiness upon irradiation with light.

It is desired that the metal foil has a thickness which is not smaller than 0.05 times and, particularly, from 0.1 to 0.25 times as great as the thickness of the insulating board 1. Upon selecting this thickness, the conducting paste 5 is compressed to a sufficient degree and is filled at an increased rate when the conducting layer 7 is buried in the step of transfer that will be described later. That is, the metal particles come into intimate contact to form via hole conducting passages of a small resistance. When the thickness is smaller than the above-mentioned range, the conducting paste is not compressed to a sufficient degree, which is disadvantageous from the standpoint of decreasing the resistance of the via hole conducting passages. When the thickness is too large, on the other hand, it becomes difficult to bury the conducting layer 7 in the insulating board 1 or the insulating board may be deformed. It is further desired that the diameter of the conducting layer 7 of a portion overlapping the via hole 4 in the insulating board 1 has been set to be 1.1 to 4 times as great as the diameter of the via hole 4. When the diameter is too small, it becomes difficult to effectively compress the conducting paste 5 filled in the via holes 4.

As the transfer sheet 6, there can be used a polyester such as polyethylene terephthalate, or polyimide, polyphenylene sulfide, polyvinyl chloride, or polypropylene. It is desired that the transfer sheet 6 has a thickness of from 10 to 500 $\mu$m and, preferably, from 20 to 300 $\mu$m. When the thickness is smaller than this range, the transfer sheet 6 tends to be deformed or folded. In forming a circuit pattern by adhering a metal foil or at the time of transfer that will be described later, therefore, the circuit pattern that is formed tends to be easily broken. When the thickness is larger than the above-mentioned range, furthermore, the transfer sheet 6 loses softness and it becomes difficult to peel off the transfer sheet 6 that is press-adhered onto the surface of the insulating board 1.

Step of Transfer:

Referring to FIG. 2(C), the transfer sheet 6 on which the conducting layer 7 is formed is press-adhered onto the insulating board 1 in a manner that the conducting layer 7 is superposed on the via hole conducting passages. Then, the transfer sheet 6 is peeled off. The conducting layer 7 (wiring circuit layer) is transferred onto the insulating board 1, and a desired circuit board unit B is obtained. The conducting layer 7 can be transferred onto both surfaces of the insulating board 1.

It is desired that the transfer sheet 6 is press-adhered under a pressure of from 1 to 300 kg/cm$^2$ and, particularly, from 20 to 70 kg/cm$^2$. Due to this press-adhesion, the conducting layer 7 is effectively buried in the surface of the insulating board 1 and, at the same time, the conducting paste is effectively compressed, making it possible to form via hole conducting passages of a small resistance. Usually, it is desired that the pressing is so effected that the filling rate of metal powder in the via hole conducting passages is not smaller than 65% and, preferably, not smaller than 75%.

Figure 2D:
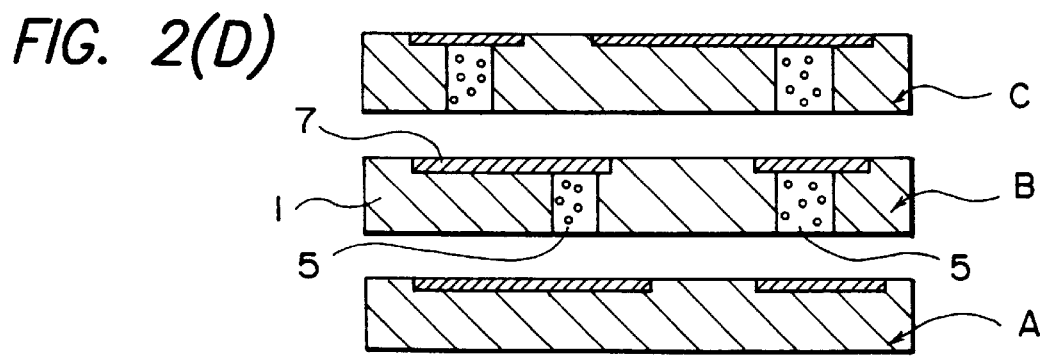

Step of Lamination:

Then, as shown in FIG. 2(D), the circuit board unit B prepared as described above is brought into match with the circuit board units A and C prepared in the same manner and are laminated under the application of a pressure of from 20 to 150 kg/cm$^2$ to laminate them as a unitary structure. Simultaneously with the application of pressure or thereafter, the heat treatment is effected to completely cure the thermosetting resin in the insulating board, in order to obtain a multilayer wiring board shown in FIG. 1.

In the above-mentioned production process, it is desired to cure and contract the thermosetting resin by heating the thermosetting resin contained in the conducting paste in the via hole conducting passages at about 150 to 300° C. simultaneously with the burying of the conducting layer 7 in the surface of the insulating board 1, after the wiring layer is formed, or simultaneously with the complete curing of the thermosetting resin in the insulating board after the circuit board units have been laminated. Due to the curing, the volume of the conducting paste contracts, whereby the metal particles are intimately adhered making it possible to effectively decrease the resistance of the via hole conducting passages. The conducting paste has a volume contraction coefficient of not smaller than 1%, desirably, from 1 to 20%, and most preferably, from 2 to 15%. When the volume contraction coefficient is smaller than the above-mentioned range, the metal particles are not sufficiently contacted to each other by the contraction, and the resistance of the formed via hole conducting passages is not sufficiently decreased. When the volume contraction coefficient is larger than the above-mentioned range, on the other hand, the electric connection is lost relative to the wiring circuit layer, and the circuit may become defective.

It is desired that the thermosetting resin constituting the insulating board 1 is oozed into the via holes 4 simultaneously with the application of pressure after the circuit board units have been laminated or in the initial stage of heating for completely curing the thermosetting resin in the insulating board. That is, voids generate in the via hole conducting passages due to the volume contraction of the conducting paste 5 or due to the decomposition of solvent or resin component in the conducting paste. The thermosetting resin that is oozed out fills the voids, stably secures the metal powder, prevents the occurrence of defect in the circuit, and enables the resistance to be reliably lowered. The thermosetting resin constituting the insulating board 1 can be oozed out by using the one having such viscosity-temperature characteristics that the viscosity is not smaller than 500 poises at a temperature of not higher than 100° C. and a minimum viscosity is not larger than 100 poises. When the viscosity is smaller than 500 poises at a temperature of not higher than 100° C., the thermosetting resin in the insulating board 1 oozes into the via hole conducting passages during the drying for removing the solvent from the conducting paste 5, and the connection among the metal particles is impaired. Besides, since the voids have been buried in the via hole conducting passages during the curing by heating we h the application of pressure, the volume of the conducting paste 5 does not contract despite a large pressure is applied, and the resistance of the via hole conducting passages is not lowered. When the minimum viscosity is larger than 100 poises, it becomes difficult to effectively ooze the thermosetting resin in the insulating board 1 into the via hole conducting passages. The viscosity characteristics of the thermosetting resin can be adjusted by suitably selecting the kind and amount of the curing agent depending upon its kind.

Figure 3:
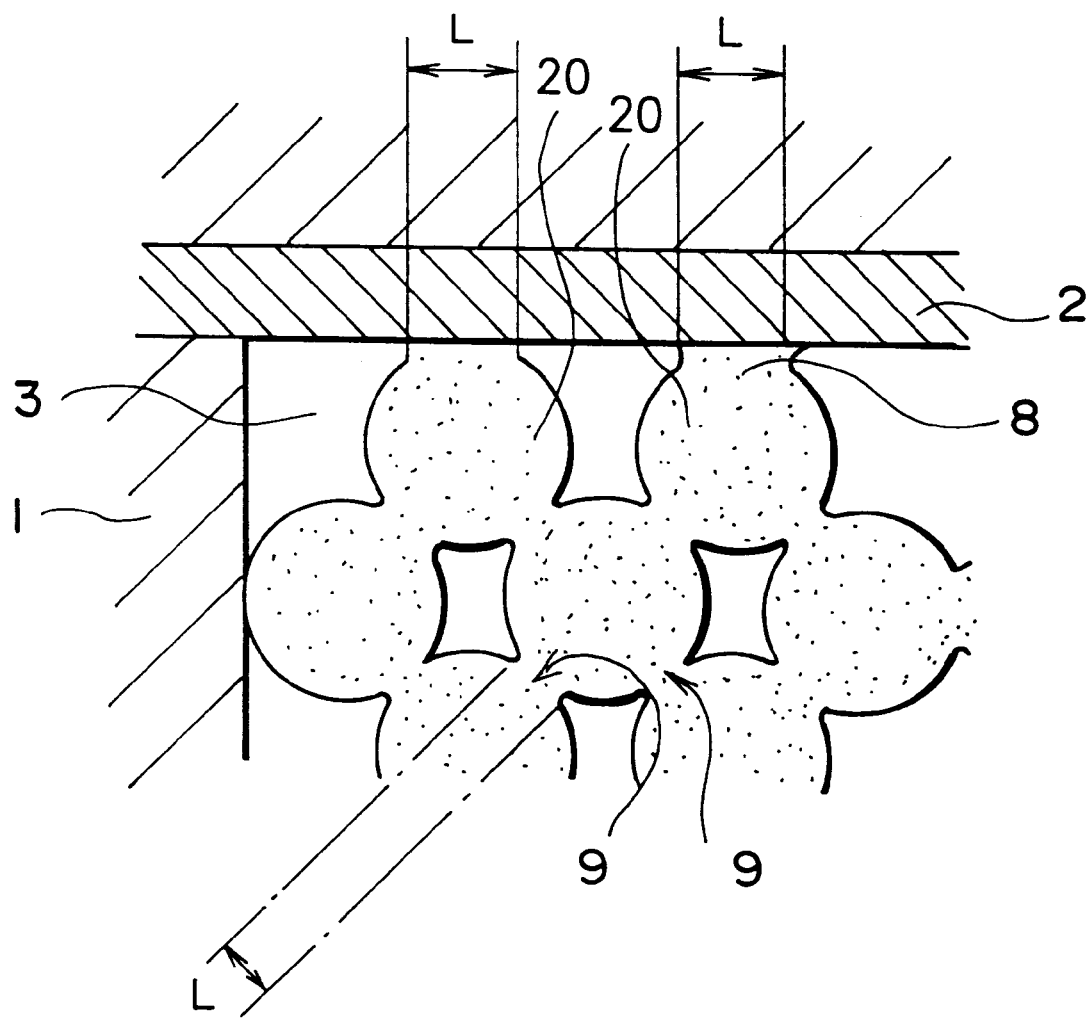
FIG. 3 is a diagram illustrating a via hole conducting passage in the multilayer wiring board of FIG. 1 on an enlarged scale.

According to the present invention, furthermore, the resistance of the conducting passages can be further decreased by applying a pulse current to the via hole conducting passages of the circuit board unit obtained as described above. That is, the metal particles in the via hole conducting passages have been oxidized on the surfaces thereof or have a resin film formed on the surfaces thereof, and are prevented from coming into direct contact with each other. Upon applying a pulse current, however, electric discharge takes place among the metal particles, and the oxide and the resin film on the surfaces are removed by the electric discharge; i.e., the metal particles are joined to one another in a so-called welded state making it possible to further decrease the resistance. Upon applying the pulse current, furthermore, the portions where the metal particles in the via hole conducting passages are contacting the wiring circuit layer are welded to very enhance the reliability of connection between them. Reference should be made to, for example, FIG. 3 which illustrates the via hole conducting passage 3 of FIG. 1 on an enlarged scale. It will be understood from FIG. 3 that the metal particles 20 are firmly welded together, and the metal particles 20 are firmly welded to the wiring circuit layer, so that the via hole conducting passage 3 exhibits a very low resistance. In FIG. 3, it is desired that the pulse current is so applied that an average of a neck width L is not smaller than one-fifth and, particularly, not smaller than two-fifths of the diameter of the metal particles at the portions 8 where the metal particles 20 are welded to the wiring circuit layer 2, and at the portions 9 where the metal particles 20 are welded together. It is particularly desired that a three-dimensional mesh structure is established by a metal component in the via hole conducting passages as shown in FIG. 3.

The pulse current is applied while pushing a flat electrode onto the insulating board 1 in which the via hole conducting passages are formed with a pressure of not smaller than 10 kg/cm$^2$.

It is desired that the current-flowing conditions consist of a voltage of 1 to 200 V, a current-flowing time for a pulse of not longer than 3 seconds, and an interval among the pulses of not longer than 3 seconds. When the voltage is smaller than 1 V, the welding by the electric discharge is not effected to a sufficient degree, and it becomes difficult to remove oxide and resin film from the surfaces of the metal particles. When the voltage exceeds 200 V, on the other hand, heat is locally generated to damage the insulating board 1. When the current-flowing time for one pulse exceeds 3 seconds, furthermore, it means that an extended period of time is required for effecting the discharge welding. An extended period of time is required, too, even when the interval among the pulses exceeds 3 seconds. In either case, the practicability is lost. In general, it is desired that the current-carrying time for one pulse and the interval among the pulses are both not longer than 0.5 seconds and, particularly, are from 0.02 to 0.1 seconds. The pulse current may have a current density of from 1 to 2000 A/cm$^2$. It is desired that the pulse current is of a rectangular wave form. It may be of a sinusoidal wave form. However, flowing a pulse current of a rectangular wave form makes it easy to establish an electric discharge among the particles and produces an increased action for cleaning the surfaces of the metal particles. It is further desired that the pulse current is a direct current. This is because, the DC pulse permits the surfaces of the particles that are once cleaned to be less contaminated again.

According to the present invention, the resistivity of the via hole conducting passages can be selected to be not larger than $3.1 \times 10^{-5}$ Ω-cm and, particularly, not larger than $1 \times 10^5$ Ω-cm relying upon the volume contraction of the conducting paste and the flow of pulses. By filling the via holes with the conducting paste, so far, the resistance could be lowered to about $7 \times 10^{-4}$ Ω-cm at the lowest. However, the above-mentioned method of the present invention makes it possible to form via hole conducting passages having a very decreased resistance.

The resistance can be further decreased by effecting the heating by flowing an electric current in a customary manner simultaneously with the flow of the pulse current or after the flow of the pulse current. By effecting the heating by the flow of current, the contacts among the metal particles generate heat, and the bonding force is enhanced among the particles. The heat treatment is carried out by flowing a direct current or an alternating current of 100 to 6000 A per 100 cm$^2$ of the insulating board, and the heating temperature by the flow of current is from 100 to 350° C. When the temperature is lower than 100° C., the resistance is not much lowered. When the temperature exceeds 350° C., on the other hand, the organic resin constituting the insulating board 1 may be decomposed.

(Production 2 of Multilayer Wiring Board)

Described below with reference to FIG. 4 is a process for producing the multilayer wiring board of the present invention based on a build-up method by utilizing the above-mentioned method of producing the circuit board unit.

Figure 4A:
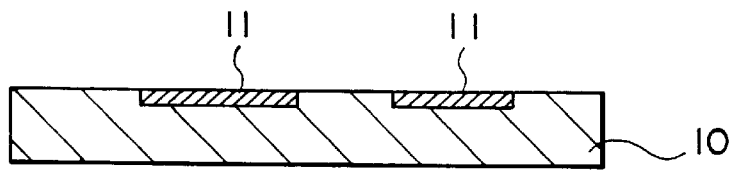
FIGS. 4(A)–4(D) is a diagram illustrating another process for producing the multilayer wiring board according to the present invention.

Step (A):

Referring, first, to FIG. 4(A), an insulating board 10 having a wiring circuit layer 11 formed in the surface is prepared. The board 10 corresponds to the lowermost insulating board 1a of the multilayer wiring board shown in FIG. 1. It is desired to form the wiring circuit layer 11 by using the transfer sheet mentioned earlier. Here, however, the insulting board 10 is provided with no via hole. Therefore, the wiring circuit layer 11 may be directly provided on the board 10 by a screen-printing method or a resist method. Moreover, the wiring circuit layer 11 may be formed on both surfaces of the board 10, or there may be employed a multilayer wiring board containing a completely cured thermosetting resin.

Figure 4B:
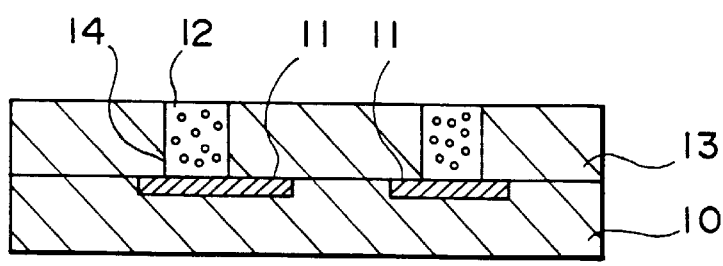

Step (B):

Referring to FIG. 4(B), a first insulating layer 13 having via hole conducting passages formed by being filled with the conducting paste, is formed on the surface of the insulating board 10 on the side of forming the wiring circuit layer.

The first insulating layer 13 is formed by applying the insulating slurry mentioned earlier onto the whole surface of the insulating board 10, followed by drying.

After the first insulating layer 13 is formed, via holes 14 are formed in the first insulating layer 13 to a depth to reach the wiring circuit layer 11, and are filled with a conducting paste. Then, as required, heating is effected to remove the solvent in the paste, thereby to form via hole conducting passages 12.

The method of forming the via holes 14 and the composition of the conducting paste are as described earlier.

It is allowable to form, on the insulating board 10, a soft insulating layer 13 having via hole conducting passages 12 formed quite in the same manner as the process shown in FIG. 2(A). The method of applying the insulating slurry is advantageous from the standpoint of forming the first insulating layer 13 without forming voids in the periphery thereof even when the wiring circuit layer 11 is formed slightly protruding beyond the surface of the insulating board 10.

Figure 4C:
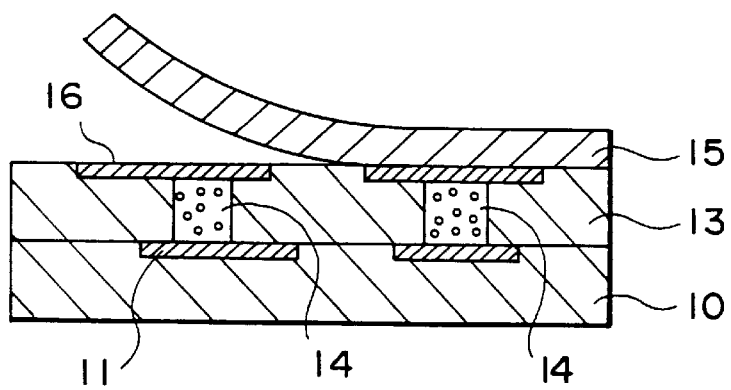

Step (C):

Referring to FIG. 4(C), a transfer sheet 15 having a wiring circuit layer 16 is overlapped and is press-adhered onto the surface of the first insulating layer 13 in which are formed via hole conducting passages, and is, then, peeled off in order to transfer the wiring circuit layer 16 onto the surface of the first insulating layer 13.

The wiring circuit layer 16 is formed on the transfer sheet 15 and is transferred onto the first insulating layer 13 quite in the same manner as the step of FIG. 2(C). In press-adhering the transfer sheet, furthermore, the thermosetting resin in the via hole conducting passages of the first insulating layer 13 is cured by heating. Thereafter, the pulse current is supplied and heating is effected by flowing a current to decrease the resistance of the via hole conducting passages.

Figure 4D:
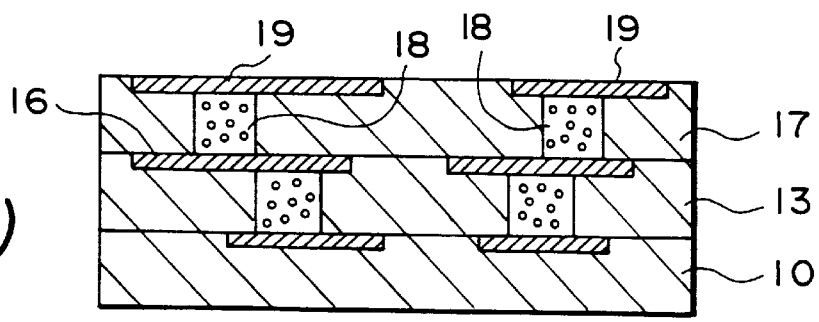

Step (D):

Thereafter, a series of the above-mentioned steps (B) and (C) are repeated on the first insulating layer 13 on which the wiring circuit layer 16 is formed, so that the insulating layers and the wiring circuit layers can be laminated in any number. After the lamination is completed, the thermosetting resin is completely cured by heating to obtain a multilayer wiring board as shown in FIG. 4(D).

When the multilayer wiring board is produced according to the process shown in FIG. 2 or 4, the insulating layer in the board is not brought into contact with a chemical solution such as etching solution, plating solution or resist-peeling solution. Therefore, the insulating layer does not lose its properties, no chemical solution infiltrates into the via hole conducting passages formed in the insulating layer, and trouble such as defect in the circuit is effectively prevented.

By using the transfer sheet, furthermore, the wiring circuit layer is formed in a step separate from the step of lamination. Compared with the conventional build-up method in which the wiring circuit layer is formed for every lamination, therefore, the time required for the step of lamination is greatly shortened, and the production efficiency is very enhanced.

EXAMPLES

Example 1

Via holes of a diameter of 0.1 mm were formed, by a carbonic acid gas laser, in a pre-preg comprising 50% by volume of a cyanate resin and 50% by volume of a glass cloth woven by using an E-glass, and were filled with a copper paste containing a copper powder plated with solver, thereby to form via hole conducting passages.

On the other hand, an adhesive was applied onto the surface of a transfer sheet made of a polyethylene terephthalate (PET) to impart adhesiveness, and a copper foil having a thickness of 12 $\mu$m and a surface roughness of 0.8 $\mu$m was adhered onto the one surface thereof. Thereafter, a photoresist was applied and was developed by exposure to light, and was then immersed in a solution of ferric chloride to remove the non-patterned portions by etching thereby to form a wiring circuit layer. The thus formed wiring circuit layer possessed a very fine pattern with a line width of 60 $\mu$m and a gap among the wirings of 60 $\mu$m.

The transfer sheet in which the above-mentioned wiring circuit layer is formed was positioned on the pre-preg, intimately adhered thereto, and was heated at 100° C. under a pressure of 100 kg/cm$^2$. Thereafter, the transfer sheet was peeled off to obtain a circuit board unit having a wiring circuit layer of copper.

Seven pieces of circuit board units each having a thickness of 125 $\mu$m were prepared in the same manner as described above, laminated on the insulating board onto which both surfaces have been transferred the wiring circuit layers, adhered under a pressure of 50 kg/cm$^2$, and were heated at 200° C. for one hour to completely cure them, in cider to prepare a multilayer wiring board.

The obtained multilayer wiring board was observed in cross section near the wiring circuit layers and the via hole conducting passages. The wiring circuit layers and the via hole conducting passages had been favorably connected. As a result of the conduction testing among the wirings, no breakage in the wiring was recognized.

Plating layers of nickel and gold were formed maintaining a thickness of 3 $\mu$m on the surface of the wiring circuit layer in the surface of the multilayer wiring board, but the plating solution did not at all infiltrate into the via hole conducting passages.

Comparative Example 1

Via hole conducting passages were formed in the pre-preg in the same manner as in Example 1, and a copper foil having a thickness of 12 $\lambda$m and a surface roughness of 0.8 $\mu$m was adhered onto the whole surface of the pre-preg by heating with the application of pressure. A resist of a photocurable resin was formed in the shape of a circuit pattern and was immersed in a solution of ferric chloride. The non-patterned portions were removed by etching, and the residual resist was removed with a resist-peeling solution, followed by washing to obtain a circuit board unit having a wiring circuit layer.

Seven pieces of the circuit board units formed in the same manner as described above were laminated on the pre-preg having wiring circuit layers formed in both surfaces thereof, adhered under a pressure of 50 kg/cm$^2$, and were completely cured by heating at 200° C. for one hour.

The obtained multilayer wiring board was observed in cross section near the wiring circuit layer, and it was learned that the insulating layers had been poorly adhered near some via holes. Discoloration due to copper was recognized near these portions. Therefore, the adhered matters were analyzed to confirm the presence of components of the etching solution. As a result of conduction testing of the wirings, furthermore, a breakage was confirmed in some wirings.

Furthermore, a plating layer of nickel was formed maintaining a thickness of 1 $\mu$m on the surface of the wiring circuit layer in the surface of the multilayer wiring board, and it was recognized that the plating solution has infiltrated into part of the via hole conducting passages near the surface.

Comparative Example 2

Via holes of a diameter of 0.1 mm were formed in a pre-preg comprising 55% by volume of a bismaleimide triazine resin and 45% by volume of a glass cloth by using a carbonic acid gas laser, and were filled with a copper paste of a copper powder of a particle size of about 5 $\mu$m plated with silver. Thereafter, a resist of a photocurable epoxy resin was formed as a permanent resist, and the circuit portions were plated with copper to obtain a circuit board unit having a wiring circuit layer. The obtained circuit layer possessed a fine pattern with a line width of 100 $\mu$m and a gap among the wirings of not larger than 100 $\mu$m.

Similarly, six pieces of circuit board units were prepared each having a thickness of 100 $\mu$m, and were positioned, laminated, adhered with a pressure of 50 kg/cm$^2$, and were completely cured by heating at 200° C. to prepare a multilayer wiring board.

The obtained multilayer wiring board was observed in cross section near the wiring circuit layer, and it was learned that the adhesion was defective between the circuit formed by plating near the via holes and the copper paste filled in the via holes. Discoloration due to copper was recognized near these portions, and the adhered matter was analyzed. As a result, the presence of components of the etching solution was recognized. As a result of conduction testing of the wiring, furthermore, a breakage in the wiring was confirmed.

A gold plating layer was formed maintaining a thickness of 0.05 $\mu$m on the surface of the wiring circuit layer in the surface of the multilayer wiring board, and it was recognized that the plating solution has infiltrated into some of the via hole conducting passages near the surface.

Example 2

A copper foil having a thickness of 12 $\mu$m and a surface roughness of 0.8 $\mu$m was adhered by heating with pressure onto the surface of a pre-preg comprising a bismaleimide triazine resin. Then, a resist of a photocurable resin was formed in the shape of a circuit pattern and was immersed in a solution of ferric chloride, and the non-patterned portions were removed by etching to obtain an insulating board having a wiring circuit layer.

On the other hand, 55% by weight of a polyimide resin and 45% by weight of a silica as an inorganic filler were mixed together. To the mixture was added a solvent comprising toluene and methyl ethyl ketone, which were then sufficiently mixed to prepare an insulating slurry having a viscosity of 500 poises.

The slurry was applied (poured) onto the surface of the insulating board in which the above-mentioned wiring circuit layer has been formed, and was dried and half-cured by heating at 120° C. to form an insulating layer. Via holes of a diameter of 100 mm were formed in the insulating layer by a laser, and were filled with a silver paste containing a copper powder.

Then, a tackifier which loses tackiness upon irradiation with light was applied onto the surface of the transfer sheet composed of a polyethylene terephthalate (PET) resin to impart tackiness, and a copper foil having a thickness of 9 $\mu$m and a surface roughness of 0.6 $\mu$m was adhered onto the one surface thereof. Thereafter, the photo resist was formed in the shape of a conducting circuit and was immersed in a solution of ferric chloride to remove the non-patterned portions by etching thereby to form a wiring circuit layer. The obtained wiring circuit layer possessed a fine pattern with a line width of 75 $\mu$m and a gap among the wirings of not larger than 75 $\mu$m.

The transfer sheet on which the above-mentioned wiring circuit layer has been formed was positioned and overlapped on the insulating layer having via hole conducting passages that have been filled with the conducting paste prepared earlier, and was heated at 70° C. with the application of pressure of 100 kg/cm$^2$. Then, the transfer sheet was peeled off while being irradiated with light from the back surface side thereof, so that the wiring circuit layer was transferred onto the surface of the insulating layer.

Thereafter, in the same manner as described above, the insulating slurry was applied onto the surface of the wiring circuit layer to form an insulating layer, via holes were formed, conducting paste was filled, and the wiring circuit layer was transferred, all repetitively, in order to prepare a multilayer wiring board having a total of eight wiring circuit layers with via hole conducting passages being formed in the insulating layers among the wiring circuit layers.

The obtained board was observed in cross section near the wiring circuit layers, and no void was recognized. As a result of conduction test of the wirings, no breakage in the wirings was recognized. Plating layers of nickel and gold were formed in a total thickness of 2 $\mu$m on the surface of the wiring circuit layer in the surface of the multilayer wiring board, but the infiltration of the plating solution into the via hole conducting passages was not at all recognized.

Example 3

Via holes of a diameter of 0.1 mm were formed in a pre-preg A (0.15 mm thick) comprising 58% by volume of PPE (polyphenylene ether) resin and 42% by volume of a glass cloth by a carbonic acid gas laser, and were filled with a copper paste containing a copper powder plated with silver to form via hole conducting passages.

Furthermore, via holes having a diameter of 0.075 mm were formed by punching in an insulating layer B (50 $\mu$m thick) formed by using a resin composition in the form of a varnish comprising 55% by volume of the PPE (polyphenylene ether) resin and 45% by volume of a silica powder relying upon the doctor blade method. The via holes were filled with a copper paste containing a copper powder plated with silver to form via hole conducting passages.

An adhesive was applied onto the surface of a transfer sheet made of the polyethylene terephthalate (PET) resin to impart tackiness, and a copper foil having a thickness of 12 $\mu$m and a surface roughness of 0.8 $\mu$m was adhered onto the whole surface. Then, the photo resist was applied followed by exposure to light and developing. The sheet was immersed in a solution of ferric chloride, and the non-patterned portions were removed by etching to form a wiring circuit layer. The formed wiring circuit layer possessed a fine pattern with a line width of 25 $\mu$m and a gap among the wirings of 25 $\mu$m.

The transfer sheet having the wiring circuit layer was intimately adhered onto the pre-preg A that has been formed, and was heated at 110° C. under a pressure of 100 kg/cm$^2$. Then, the transfer sheet only was peeled to transfer the wiring circuit layer onto the pre-preg A. In the same manner, the wiring circuit layer was also transferred onto the back surface of the pre-preg A.

The insulating layer B was positioned and adhered onto the surface of the pre-preg A that possessed the wiring circuit layers formed on both surfaces thereof. Then, in the same manner as described above, the transfer sheet having the wiring circuit layer was adhered by heating at 70° C. with the application of pressure of 100 kg/cm². The transfer sheet only was, then, peeled off to form the wiring circuit layer on the surface of the insulating layer B. Similarly, the insulating layer B was also laminated even on the back surface of the pre-preg A in order to form the wiring circuit layer.

Then, according to the above-mentioned procedure, another insulating layer B was laminated on the insulating layers B that have been laminated on both the front and back surfaces of the pre-preg A and having a wiring circuit layer in the surface thereof, and the wiring circuit layers were formed thereon, in order to obtain a BBABB layer structure and, hence, to obtain a noncured multilayer wiring board (0.35 mm thick) having wiring circuit layers among the layers and on both surfaces. The board was adhered with a pressure of 20 kg/cm², and was heated in vacuum at a temperature of 200° C. for one hour to completely cure it and to obtain a desired multilayer wiring board. In the multilayer wiring board, the via hole conducting passages formed in the insulating layer B have been sealed at their both ends with the wiring circuit layers.

The obtained multilayer wiring board was observed in cross section near the wiring circuit layers and the via hole conducting passages, and it was learned that the connection was favorable between the wiring circuit layers and the via hole conducting passages. As a result of conduction testing among the wirings, no breakage in the wiring was recognized.

The multilayer wiring board was left to stand in a high-temperature and high-humidity atmosphere of a humidity of 85% and a temperature of 85° C. for 100 hours. However, no change has occurred to a degree that could be perceived by eyes. The multilayer wiring board was left to stand for another 1000 hours but the insulating layer B was not peeled off.

Example 4

A slurry was prepared by mixing 65% by volume of silicon oxide of a nearly spherical shape having an average particle size of about 5 $\mu$m, 35% by volume of a phenol resin and a curing agent. The slurry was applied onto a carrier sheet by the doctor blade method, dried at a temperature of 50° C. for 60 minutes to form a half-cured insulating layer of a square shape having a side of 200 mm and a thickness of 200 $\mu$m. Then, via holes of a diameter of 200 $\mu$m were formed therein by punching.

Then, the via holes in the insulating layer were filled with a conducting paste comprising 75% by volume of a copper powder having an average particle size of 4 $\mu$m and 25% by volume of a bisphenol-type epoxy resin. By using the paste of the same composition, furthermore, lands of a diameter of 300 $\mu$m were printed, by the screen-printing method, on the back and front surfaces where the via holes were exposed, and were dried and half-cured at a temperature of 80° C. for 10 minutes, and were then heated at 150° C. for one hour to thermally cure the insulating layer and the conducting paste, thereby to prepare wiring boards (samples Nos. 3 to 13) having via hole conducting passages formed in the insulating layer. The volume contraction factor of the conducting paste under the above-mentioned curing conditions was 5%.

A pulse current was applied to the lands of the via hole conducting passages in the wiring boards under the conditions as shown in Table 1, and some of the boards were heated by flowing a current under the conditions as shown in Table 1. After the treatment, the resistivities of the via hole conducting passages in the wiring boards were measured. The results were as shown in Table 1.

Example 5

A slurry was prepared by mixing 70% by volume of silicon oxide of a nearly spherical shape having an average particle size of about 5 $\mu$m, 30% by volume of a novolak-type epoxy resin and a curing agent. The slurry was applied onto a carrier sheet by the doctor blade method, dried at a temperature of 60° C. for 60 minutes to form a half-cured insulating layer of a square shape having a side of 200 mm and a thickness of 200 $\mu$m. Then, via holes of a diameter of 100 $\mu$m were formed therein by punching.

Then, the via holes in the insulating layer were filled with a conducting paste comprising 70% by volume of a copper powder having an average particle size of 1 $\mu$m and 30% by volume of a novolak-type epoxy resin. By using the paste of the same composition, furthermore, lands of a diameter of 300 $\mu$m were printed, by the screen-printing method, on the back and front surfaces where the via holes were exposed, and were dried and half-cured at a temperature of 100° C. for 30 minutes, and were then heated at 150° C. for 30 minutes to thermally cure the insulating layer and the conducting paste, thereby to prepare wiring boards (samples Nos. 14 and 15) having via hole conducting passages formed in the insulating layer. The volume contraction coefficient of the conducting paste under the above-mentioned curing conditions was 8%.

A pulse current was applied to the thus obtained wiring boards in the same manner as in Example 4 and/or the heating was effected by flowing a current. Resistivities of the via hole conducting passages in the wiring boards were measured. The results were as shown in Table 1.

Example 6

A slurry was prepared by mixing 50% by volume of silicon oxide of a nearly spherical shape having an average particle size of about 5 $\mu$m, 50% by volume of an imide resin and a curing agent. The slurry was applied onto a carrier sheet by the doctor blade method, dried at a temperature of 80° C. for 30 minutes to form a half-cured insulating layer of a square shape having a side of 200 mm and a thickness of 100 $\mu$m. Then, via holes of a diameter of 75 $\mu$m were formed therein by punching.

Then, the via holes in the insulating layer were filled with a conducting paste comprising 75% by volume of a copper powder having an average particle size of 0.7 $\mu$m and 25% by volume of an imide resin. By using the paste of the same composition, furthermore, lands of a diameter of 200 $\mu$m were printed, by the screen-printing method, on the back and front surfaces where the via holes were exposed, and were dried and half-cured at a temperature of 150° C. for 60 minutes, and were then heated at 300° C. for 30 minutes to thermally cure the insulating layer and the conducting paste, thereby to prepare wiring boards (samples Nos. 16 and 17) having via hole conducting passages formed in the insulating layer. The volume contraction coefficient of the conducting paste under the above-mentioned curing conditions was 2%.

A pulse current was applied to the thus obtained wiring boards in the same manner as in Example 4 and/or the heating was effected by flowing a current. Resistivities of the via hole conducting passages in the wiring boards were measured. The results were as shown in Table 1.

Comparative Example 3

Via holes in the insulating layer formed in Example 1 were filled with a conducting paste comprising 93% by volume of a copper powder having an average particle diameter of 5 μm and 7% by volume of a cellulose. Then, by using the paste of the same composition, lands of a diameter of 300 μm were printed, by the screen-printing method, on the back and front surfaces where the via holes were exposed, and were half-cured at a temperature of 70° C. for 30 minutes, and were then heated at a temperature of 150° C. for one hour to thermally cure the insulating layer and the conducting paste thereby to obtain a wiring board (sample No. 18) having via hole conducting passages formed in the insulating layer. The volume contraction coefficient of the conducting paste under the above-mentioned curing conditions was not larger than 0.2%.

A pulse current was applied to the thus obtained wiring boards in the same manner as in Example 4 and/or the heating was effected by flowing a current. Resistivities of the via hole conducting passages in the wiring boards were measured. The results were as shown in Table 1.

Example 7

A slurry was prepared by using 70% by volume of silicon oxide of a nearly spherical shape having an average particle diameter of about 5 μm and 30% by volume of an imide resin, and was applied onto a carrier sheet by the doctor blade method followed by drying at a temperature of 50° C. for 60 minutes to obtain an insulating layer having a thickness of 120 μm.

Next, via holes having a diameter of 0.1 mm were formed in the insulating layer by NC punching, and were filled with a conducting paste prepared by mixing 99.8 parts by weight of a silver-coated copper powder having an average particle diameter of 5.3 μm and containing 3 parts by weight of silver, 0.2 parts by weight of cellulose, and 10 parts by weight of 2-octanol as a solvent. Transfer films on which has been formed a wiring circuit layer of a copper foil were laminated on the front and back surfaces of the insulating layer in so that the via hole conducting passages were

TABLE 1

| Sample No. | Pulse current consition | | | | Heating condition | | | Volume Contraction factor when via hole Passages are cured (%) | Resistivity (Ω –cm) | Remarks |
| --- | --- | --- | --- | --- | --- | --- | --- | --- | --- | --- |
| | Volume (V) | Pulse time (sec) | Pulse interval (sec) | Conductor temp. (° C.) | Volume (V) | Current-flowing time (sec) | Conductor temp. (° C.) | | | |
| *1 | not treated | | | | not treated | | | 5.0 | 7 × 10⁻⁵ | |
| *2 | not treated | | | | 80 | 180 | 230 | 5.0 | 5 × 10⁻⁵ | |
| 3 | 15 | 0.01 | 0.01 | 45 | not treated | | | 5.0 | 8 × 10⁻⁶ | |
| 4 | 12 | 0.03 | 0.03 | 45 | not treated | | | 5.0 | 8 × 10⁻⁶ | |
| 5 | 10 | 0.07 | 0.07 | 45 | not treated | | | 5.0 | 9 × 10⁻⁶ | |
| 6 | 18 | 0.2 | 0.2 | 50 | not treated | | | 5.0 | 9.5 × 10⁻⁶ | |
| 7 | 25 | 3.0 | 3.0 | 70 | not treated | | | 5.0 | 2 × 10⁻⁵ | |
| 8 | 30 | 0.01 | 0.01 | 45 | 60 | 180 | 100 | 5.0 | 1 × 10⁻⁵ | |
| 9 | 5 | 0.03 | 0.03 | 45 | 80 | 120 | 200 | 5.0 | 8 × 10⁻⁶ | |
| 10 | 7 | 0.07 | 0.07 | 45 | 80 | 240 | 250 | 5.0 | 7 × 10⁻⁶ | |
| 11 | 30 | 0.2 | 0.2 | 50 | 90 | 240 | 350 | 5.0 | 8 × 10⁻⁶ | partly discolored |
| 12 | 25 | 0.5 | 0.5 | 40 | 100 | 120 | 400 | 5.0 | 9 × 10⁻⁶ | partly carbonized |
| 13 | note 1 | 0.05 | 0.05 | 60 | — | — | — | 5.0 | 7 × 10⁻⁶ | |
| 14 | 10 | 0.05 | 0.05 | 60 | 50 | 120 | 150 | 8.0 | 9 × 10⁻⁶ | |
| 15 | " | " | " | " | 70 | 180 | 190 | " | 7 × 10⁻⁶ | |
| 16 | " | " | " | " | 80 | 180 | 250 | 1.0 | 7 × 10⁻⁶ | |
| 17 | " | " | " | " | 90 | 240 | 350 | " | 5 × 10⁻⁶ | |
| *18 | " | " | " | " | 70 | 180 | 190 | <0.2 | 4 × 10⁻⁵ | |

The samples marked with * lie outside the scope of the invention.
Note 1) A voltage of 50 V was added to a pulse voltage of 100 V, and a pulse current was applied simultaneously with the heating by flowing a current.

According to the results of Table 1, the sample No. 1 to which no pulse current was applied and which was not heated by flowing a current exhibits a resistivity of the via hole conducting passages of 7×10⁻⁵ Ω-cm. The same sample No. 2 but which was heated by flowing a current exhibits a resistivity that is decreased to 5×10⁻⁵ Ω-cm.

On the other hand, when a pulse current is applied according to the present invention, the resistivities of the via hole conducting passages decrease to smaller than 4×10⁻⁵ Ω-cm. In the samples having a volume contraction coefficient of not smaller than 1% at the time of curing the conducting wiring layers, in particular, the resistivities decrease down to not larger than 2×10⁻⁵ Ω-cm. When the voltage is adjusted to 10 to 18 V, the pulse-flowing time is set to 0.01 to 0.2 seconds and the pulse interval is set to 0.01 to 0.2 seconds, furthermore, the resistivities can be decreased down to 9.5×10⁻⁶ Ω-cm. In the samples that are heat-treated by flowing a current in addition to applying a pulse current, furthermore, the resistivities can be decreased down to not larger than 1×10⁻⁵ Ω-cm.

sandwiched, and were adhered with a pressure of 50 kg/cm². The transfer films were then peeled off to transfer the wiring circuit layers. Thereafter, the insulating layer was heated at 120° C. to remove the organic solvent in the paste by volatilization, and was further heated at 250° C. for 5 hours to completely cure the insulating layer.

A pulse current of a current density and a pulse width shown in Table 2 was applied for 30 seconds between the wiring circuit layers at both ends of the via hole conducting passages in the wiring board. The pulse interval was set to be equal to the pulse width. Some of the boards were further heated by flowing a current under the conditions shown in Table 2.

The wiring boards after treated were measured for their initial resistance of the via hole conducting passages. The conduction resistance (test 1) at 85° C. and 85% of relative humidity after 1000 hours have passed, and the conduction resistance (test 2) over a temperature range of from −65 to +140° C. after 1000 cycles, were measured, and changes in the resistances under the respective conditions were calculated to be as shown in Table 2.

Furthermore, the contacting state between the copper foil of the wiring circuit layer and the via hole passages was observed through a scanning-type electron microphotograph to find the growth of neck due to the welding and an average neck width/metal particle diameter. The results were as shown in Table 2.

particle diameter of 4 μm and coated with silver on the surfaces thereof, 0.2 parts by weight of cellulose and 10 parts by weight of 2-octanol, followed by heating and drying at 140° C. for 30 minutes to form via hole conducting passages.

Then, relying upon the photo resist method, a wiring layer for the front surface and a wiring layer for the back surface were formed on two pieces of transfer sheets to which have

TABLE 2

| Sample No. | Pulse current Condition | | Heating by flowing a current condition | | Initial resistance ($\Omega$-cm × $10^{-6}$) | Change in the resistance (%) | | Neck ratio |
|---|---|---|---|---|---|---|---|---|
| | Current density (A/cm²) | Pulse width (sec) | Current density (A/cm²) | Current-flowing time (sec) | | test 4 | test 2 | |
| *1 | not treated | | not treated | | 63 | 10.5 | 10.3 | 0 |
| *2 | not treated | | 2000 | 60 | 58 | 9.6 | 9.5 | 0 |
| *3 | 0.5 | 0.01 | not treated | | 55 | 9.5 | 9.3 | 0.07 |
| *4 | 0.7 | 0.01 | not treated | | 50 | 9.3 | 9.1 | 0.11 |
| *5 | 0.7 | 0.05 | not treated | | 52 | 9.6 | 9.3 | 0.18 |
| 6 | 100 | 0.01 | not treated | | 28.2 | 4.5 | 4.3 | 0.21 |
| 7 | 100 | 0.02 | not treated | | 30.1 | 4.7 | 4.5 | 0.21 |
| 8 | 100 | 0.05 | not treated | | 30.8 | 4.8 | 4.6 | 0.20 |
| 9 | 500 | 0.02 | not treated | | 9.6 | 4.3 | 4.3 | 0.23 |
| 10 | 500 | 0.05 | not treated | | 10.1 | 4.5 | 4.4 | 0.22 |
| 11 | 1000 | 0.01 | not treated | | 7.3 | 3.9 | 3.7 | 0.30 |
| 12 | 1000 | 0.02 | not treated | | 7.5 | 4.0 | 3.8 | 0.29 |
| 13 | 1000 | 0.02 | 2000 | 60 | 7.0 | 3.7 | 3.6 | 0.32 |
| 14 | 1000 | 0.02 | 3000 | 60 | 6.8 | 3.5 | 3.4 | 0.36 |
| 15 | 1000 | 0.02 | 3500 | 60 | 6.6 | 3.1 | 3.2 | 0.38 |
| 16 | 1000 | 0.05 | 2000 | 60 | 7.2 | 3.3 | 3.2 | 0.32 |
| 17 | 1500 | 0.02 | not treated | | 7.3 | 3.3 | 3.1 | 0.31 |
| 18 | 1500 | 0.02 | 2000 | 60 | 6.9 | 3.0 | 2.9 | 0.35 |
| 19 | 3000 | 0.02 | not treated | | 7.0 | 3.6 | 3.5 | 0.40 |

Samples marked with * lie outside the range of the present invention.

According to the results of Table 2, the initial resistance through the wiring circuit layer—via hole conducting passage—wiring circuit layer can be decreased down to smaller than $3.1 \times 10^{-5}$ $\Omega$-cm when the contacting portions among the wiring circuit layers and the via hole conducting passages are so welded, i.e., when the contacting portions between the metal foil and the metal particles are so welded that a ratio of the neck width/metal particle diameter is not smaller than 1/5. In this case, a change in the resistance is smaller than 5% even after the cyclic testing, and a high reliability of connection is maintained for extended periods of time. By effecting the heating by flowing a current in addition to applying a pulse current, furthermore, it is made possible to further decrease the resistance and to decrease a change in the resistance. When the density of pulse current exceeds 2000 A/cm² (sample No. 19), however, both the initial resistance and a change in the resistance are small, but a discoloration appears on the insulating layer around the via hole conducting passages.

Example 8

An imide resin which is an organic resin was used as an insulating layer, and spherical silica was used as an inorganic filler. A composition was prepared by using these organic resin and the inorganic filler at a volume ratio of 30:70, and was formed into a half-cured insulating layer of a thickness of 120 μm by the doctor blade method and in which were formed via holes of a diameter of 0.1 mm at predetermined positions by punching.

The via holes were filled with a metal paste of a mixture of 100 parts by weight of a copper powder having an average been adhered a copper foil of a thickness of 2.5 to 70 μm. The transfer sheets were positioned and overlapped on the front surface and on the back surface of the insulating layer in which the via hole conducting passages have been formed. A pressure of 50 kg/cm² was applied onto at least the portions where the via hole conducting passages were formed, the wiring layers were buried in the insulating layer from the sides of both ends of the via hole conducting passages, followed by heating at 120° C. A minimum diameter of the wiring layers formed at the ends of the via hole conducting passages was set to be 0.2 mm.

The obtained wiring boards were measured for the resistances of the via hole conducting passages. To some of the wiring boards was applied a pulse current under the conditions of a pulse width of 20 msec, a pulse interval of 20 msec, a pulse voltage of 10 V, a pulse current of 500 A and an application time of one minute, or some of the wiring boards were heated by flowing a current under the conditions of a voltage of 20 V, a current of 50 A and an application time of one minute. Similarly, the wiring boards were measured for their resistances of the via hole conducting passages.

As comparative examples, furthermore, the wiring layers of a metal foil were formed at the ends of the via hole conducting passages but were not buried (compression was not effected for the via hole conducting passages), the wiring layer was buried for the via hole conducting passages from one side only, and the wiring layer was formed by printing the metal paste instead of using the metal foil. The resistances were measured in the same manner.

The via hole conducting passages were impregnated with a resin for observation, and were cut to conduct the image analysis of the cross section. The filling rate of a metal powder in the via hole conducting passages was found based on the area in which the resin for observation was not present. The results were as shown in Table 3.

TABLE 3

Thickness of insulating layer L = 120 μm

| Sample No. | Kind of Wiring layer | Thickness of wiring layer (μm) | Ratio to insulating layer thickness L | After-treatment | Filling rate (%) | Through-hole resistance (Ω-cm) | Remarks |
|---|---|---|---|---|---|---|---|
| *1  | metal foil | 18  | 0.15  | —              | 55 | $9 \times 10^{-5}$   | no pressure applied |
| *2  | metal foil | 2.5 | 0.02  | —              | 57 | $9 \times 10^{-5}$   |  |
| 3   | metal foil | 9   | 0.075 | —              | 60 | $1 \times 10^{-5}$   |  |
| 4   | metal foil | 12  | 0.1   | —              | 65 | $7 \times 10^{-6}$   |  |
| 5   | metal foil | 18  | 0.15  | —              | 70 | $6 \times 10^{-6}$   |  |
| 6   | metal foil | 18  | 0.15  | —              | 65 | $7 \times 10^{-6}$   | only one side of wiring layer |
| 7   | metal foil | 18  | 0.15  | pulse applied  | 75 | $5 \times 10^{-6}$   |  |
| 8   | metal foil | 35  | 0.29  | pulse applied  | 78 | $4 \times 10^{-6}$   |  |
| 9   | metal foil | 35  | 0.29  | heat by current | 73 | $5.5 \times 10^{-6}$ |  |
| 10  | metal foil | 35  | 0.29  | pulse + current | 75 | $5 \times 10^{-5}$   |  |
| 11  | metal foil | 35  | 0.29  | —              | 70 | $6 \times 10^{-6}$   | only one side of wiring layer |
| 12  | metal foil | 35  | 0.29  | —              | 74 | $6 \times 10^{-6}$   |  |
| 13  | metal foil | 70  | 0.58  | —              | 65 | $7 \times 10^{-6}$   | circuit deformed |
| *14 | paste      | 20  | 0.17  | —              | 56 | $8 \times 10^{-5}$   |  |

Samples marked with * lie outside the range of the invention.

As will be obvious from the results of Table 3, the samples Nos. 6 and 11 in which the wiring layer was buried from one side exhibited decreased resistances compared with the sample No. 1 in which the wiring layer was buried according to the prior art (via hole conducting passages were not compressed).

In the sample No. 12 in which the wiring layer was formed by printing the metal paste, the wiring layer was deformed and the pressure was not sufficiently applied to the via hole conducting passages.

In the samples in which the pressure was applied from both sides through the wiring layers of a metal foil, the resistances of the via hole conducting passages could be decreased down to smaller than $1 \times 10^{-5}$ Ω-cm. In the sample No. 2 in which the thickness of the wiring layer was smaller than 0.05 times of the thickness L of the insulating layer, however, the compression could not be sufficiently effected, and the resistance could not be sufficiently decreased.

Upon applying a pulse current and effecting the heating by flowing a current, the resistance could be further decreased.

Example 9

An aramid nonwoven fabric was impregnated with a slurry containing a polyimide resin, and was heated at 60° C. and was half-cured to prepare a pre-preg. The ratio of contents was 50% by volume of the polyimide resin and 50% by volume of the nonwoven fabric of the aramid resin. Via holes of a diameter of 0.1 mm were formed in the pre-preg by a carbonic gas laser, and were filled with a copper paste containing a silver-plated copper powder to form via hole conducting passages thereby to prepare an insulating sheet (A) for the inner layer.

On the other hand, a varnish-like resin and a powder were mixed together at a ratio of 50% by volume of the polyimide resin and 50% by volume of the silica powder, and an insulating sheet was formed by the doctor blade method and was heated at 60° C. and was half-cured. Via holes of a diameter of 0.1 mm were formed in the insulating sheet by punching and were filled with a copper paste containing a silver-plated copper powder to thereby form via hole conducting passages and, hence, to prepare an insulating sheet (B) for the outermost layer.

Furthermore, an adhesive was applied to the surface of a transfer sheet composed of a polyethylene terephthalate (PET) resin to impart tackiness, and a copper foil having a thickness of 12 μm and a surface roughness of 0.8 μm was adhered to the surface thereof. Then, a photo resist was applied thereto and was developed by exposure to light, and was immersed in a solution of ferric chloride to remove the non-patterned portions by etching in order to form the wiring circuit layer. The formed wiring circuit layer possessed a fine pattern with a line width of 60 μm and a gap among the wirings of 60 μm.

A transfer sheet having the above-mentioned wiring circuit layer was superposed on the surface of the insulating sheet (A) for the inner layer and was adhered thereto with pressure. Then, the transfer sheet only was peeled off to transfer the wiring circuit layer. Similarly, furthermore, the wiring circuit layer was transferred onto the surface of the insulating sheet (B) for the outermost layer.

The insulating sheets for the outermost layer were laminated on the upper side and the lower side of a laminate of three pieces of insulating sheets (A) for the inner layers on which the wiring circuit layers have been formed as mentioned above, and were press-adhered thereto with a pressure of 50 kg/cm², followed by heating at 200° C. for one hour to completely cure them thereby to obtain a multilayer wiring board. The outermost insulating layer without containing aramid resin possessed a thickness of 50 μm. The outermost layer possessed a coefficient of thermal expansion of 25 ppm/° C. over a temperature range of from room temperature to 150° C.

The obtained multilayer wiring board was observed in cross section near the wiring circuit layers and the via hole conducting passages. As a result, the wiring circuit layers and the via hole conductors had been favorably connected. As a result of conduction testing among the wirings, no breakage in the wirings was recognized.

The obtained multilayer wiring board was left to stand in a high-temperature and high-humidity atmosphere of a humidity of 85% and a temperature of 85° C. for 100 hours, but there developed no change that could be discerned by eyes. After left to stand for 1000 hours, the insulating layers were slightly peeled off in the peripheral portions.

The heat cycle testing was conducted over a temperature range of from room temperature to 150° C., and no change was recognized even after 200 cycles.

Comparative Example 4

The insulating sheet for the inner layer was prepared in the same manner as in Example 8, and the via holes were formed therein in the same manner and were filled with a conducting paste to form via hole conducting passages. Onto the surface of the sheet was adhered a copper foil having a thickness of 12 μm, and the resin was cured using a vacuum laminating machine. Thereafter, a photo resist was applied to the copper foil and was developed by being exposed to light. The sheet was then immersed in a solution of ferric chloride and the non-patterned portions were removed by etching, thereby to form a wiring circuit layer. The thus formed wiring circuit layer possessed a fine pattern with a line width of 60 μm and a gap among the wirings of 60 μm.

Seven insulating sheets having via hole conducting passages and wiring circuit layers formed therein were laminated, adhered together with a pressure of 50 kg/cm$^2$, heated at 200° C. for one hour to completely cure them, thereby to obtain a multilayer wiring board.

The thus obtained multilayer wiring board was observed in cross section near the wiring circuit layers and the via hole conducting passages. The wiring circuit layers and the via hole conducting passages were favorably connected together. As a result of conduction testing among the wirings, no breakage in the wirings was recognized.

The obtained multilayer wiring board was left to stand for 100 hours in a high-temperature and high-humidity atmosphere of a humidity of 85% and a temperature of 85° C. As a result, the insulating layers were separated from each other and were wholly undulated. After left to stand for 1000 hours, the multilayer wiring board no longer maintained its original shape. As a result of heat cycle testing over a temperature range of from room temperature to 150° C., no change was recognized even after 200 cycles.

Example 10

In the same manner as in Example 9, a pre-preg was prepared by impregnating the aramid nonwoven fabric with a BT resin such that the amount of the polyaminobismaleimide resin was 55% by volume and the amount of the aramid nonwoven fabric was 45% by volume. Via holes of a diameter of 0.1 mm were formed in the pre-preg by a carbonic acid gas laser and were filled with a copper paste comprising a copper powder having a particle size of about 5 μm and plated with silver, in order to prepare an insulating sheet (A) having via hole conducting passages for inner layers.

Furthermore, a varnish-like resin and a powder were mixed together such that the amount of the polyaminobismaleimide resin was 50% by volume and the amount of the silica powder was 50% by volume. The mixture was formed into a sheet-like insulating layer by the doctor blade method. Via holes of a diameter of 0.1 mm were formed therein by punching, and were filled with a copper paste containing a copper powder plated with silver to form via hole conducting passages thereby to prepare an insulating sheet (B) for the outermost layer.

Like in Example 9, the wiring circuit layer was transferred onto the insulating sheets (A) and (B) from the transfer sheet. Two pieces of the insulating sheets (B) were laminated as outermost layers on the upper side and lower side of a laminate of three pieces of the insulating sheets (A), and were adhered with a pressure of 50 kg/cm$^2$, followed by heating at 200° C. for one hour to completely cure them, thereby to prepare a multilayer wiring board. The outermost insulating layer without containing the aramid resin possessed a thickness of 75 μm. The outer most insulating layer possessed a coefficient of thermal expansion of 20 ppm/° C. over a temperature range of from room temperature to 150° C.

The obtained multilayer wiring board was observed in cross section near the wiring circuit layers and the via hole conducting passages. The wiring circuit layers and the via hole conducting passages were favorably connected together. As a result of conduction testing among the wirings, no breakage in the wirings was recognized.

The obtained multilayer wiring board was left to stand in a high-temperature and high-humidity atmosphere of a humidity of 85% and a temperature of 85° C. for 100 hours, but there developed no change that could be discerned by eyes. After left to stand for 1000 hours, the insulating layers were slightly peeled off in the peripheral portions.

The heat cycle testing was conducted over a temperature range of from room temperature to 150° C., and no change was recognized even after 200 cycles.

Comparative Example 5

A moisture-preventing layer composed of a photosensitive imide resin was formed maintaining a thickness of 10 μm on the surface of the wiring board prepared in Comparative Example 4, in order to obtain a multilayer wiring board having seven insulating layers.

The obtained multilayer wiring board was observed in cross section near the wiring circuit layers and the via hole conducting passages. The wiring circuit layers and the via hole conducting passages were favorably connected together. As a result of conduction testing among the wirings, no breakage in the wirings was recognized.

The obtained multilayer wiring board was left to stand for 100 hours in a high-temperature and hiah-humidity atmosphere of a humidity of 85% and a temperature of 85° C. As a result, the insulating layers were partly separated from each other and the multilayer wiring board as a whole was slightly deformed. After left to stand for 1000 hours, the multilayer wiring board no longer maintained its original shape. As a result of heat cycle testing over a temperature range of from room temperature to 150° C., the moisture-preventing layer was peeled off after 200 cycles.

Comparative Example 6

A varnish-like polyimide resin was formed into an insulating sheet by the doctor blade method, and was half-cured by heating at 60° C. Via holes of a diameter of 0.1 mm were formed in the insulating sheet by punching and were filled with a copper paste containing a silver-plated copper powder to form via hole conducting passages. By using a transfer sheet, a wiring circuit layer was formed on the surface thereof to prepare an insulating sheet for the outermost layer.

Then, in the same manner as in Example 9, the insulating sheets for the outermost layer were laminated on the upper side and the lower side of a laminate of three pieces of insulating sheets for the inner layers in which the via hole conducting passages have been formed and on which the wiring circuit layers have been formed, and were press-adhered thereto with a pressure of 50 kg/cm$^2$, followed by heating at 200° C. for one hour to completely cure them thereby to obtain a multilayer wiring board. The outermost insulating layer without containing aramid resin possessed a thickness of 50 μm. The outermost layer possessed a coefficient of thermal expansion of 55 ppm/° C. over a temperature range of from room temperature to 150° C.

The obtained multilayer wiring board was observed in cross section near the wiring circuit layers and the via hole conducting passages. As a result, the wiring circuit layers and the via hole conductors had been favorably connected. As a result of conduction testing among the wirings, no breakage in the wirings was recognized.

The obtained multilayer wiring board was left to stand in a high-temperature and high-humidity atmosphere of a humidity of 85% and a temperature of 85° C. for 100 hours, but there developed no change that could be discerned by eyes. After left to stand for 1000 hours, the insulating layers were slightly peeled off in the peripheral portions.

As a result of the heat cycle testing, the outermost layer was peeled off after 200 cycles lacking stability.

Example 11

As a highly strong insulating layer, there was prepared a pre-preg having a thickness of 200 μm by impregnating a glass fabric or an aramid nonwoven fabric with 50% by volume of a BT resin, PPE or polyimide. To the BT resin were further added 40 to 60% by volume of aluminum borate ($Al_{18}B_4O_{33}$) whiskers (AlBO(W)) having an aspect ratio of 6, as well as butyl acetate, toluene or methyl ethyl ketone (MEK) as a solvent, and a catalyst for promoting the curing of the organic resin. The mixture was stirred for one hour using a stirrer having stirrer vanes which turn while rotating. Thereafter, the slurry was formed into a sheet of a thickness of 200 μm by the doctor blade method.

A highly strong insulating layer was also prepared for comparison. That is, to the BT resin, to the PPE or to the polyimide were added 50% by volume of a spherical molten $SiO_2$ having an average particle diameter of 5 μm, as well as butyl acetate, toluene or MEK as a solvent, and a catalyst for promoting the curing of the organic resin. The mixture was stirred for one hour using a stirrer having stirrer vanes that turn while rotating. Thereafter, the slurry was formed into an insulating sheet of a thickness of 200 μm by the doctor blade method.

To form a surface insulating layer, furthermore, a spherical molten $SiO_2$, $BaTiO_3$, $MgTiO_3$ or $CaTiO_3$ having an average particle diameter of 5 μm was added at a ratio shown in Tables 4 and 5 to the BT resin, PPE or polyimide, followed by the addition of butyl acetate, toluene or MEK as a solvent, and a catalyst for promoting the curing of the organic resin. The mixture was stirred for one hour using a stirrer having stirrer vanes that turn while rotating. The slurry was then formed into a sheet having a thickness of 200 μm by the doctor blade method.

The thus prepared insulating layers were measured for their coefficients of thermal expansion at room temperature up to 150° C. The results were as shown in Tables 4 and 5.

Next, the insulating layers were cut into a square of 150 mm, and via holes were formed therein by a $CO_2$ laser. On the insulating layers were formed, by the transfer method, a circuit having a line width of 50 μm and a distance among the circuits of 50 μm, and the via holes were filled with a copper paste. Then, the insulating layers were laminated in a number of two on both the upper surface and the lower surface of the highly strong insulating layer to obtain a laminate of a total of five layers. The laminate was then heated at 200° C. for two hours to completely cure it in a nitrogen atmosphere, thereby to obtain a multi-layer wiring board.

The insulating layers were measured for their flexural strengths in the form of test pieces measuring 0.5×3×15 mm based upon a three-point bending strength measurement with a span of 10 mm. As for the strength of the multilayer wiring board, a load was applied with a span of 10 mm, and a breaking load was measured at the time when the board was broken. The results were as shown in Tables 4 and 5.

Semiconductor elements and other electronic parts were adhered, using a die-bonding paste, to the surface of the outermost insulating layer of the multilayer wiring board, which was then permitted to naturally fall from a height of 200 cm. Among 20 samples, the number of the boards that were damaged was checked. The results were as shown in Tables 4 and 5.

The multilayer wiring boards were subjected to the heat cycle of from −40 to 125° C. to observe the presence of peeling among the insulating layers. Among 20 samples of each of the boards, the numbers of the defective boards were checked. The results were as shown in Tables 4 and 5.

TABLE 4

| Sample No. | Composition of highly strong insulating layer (% by vol.) | | | Strength (MPa) | α (ppm/° C.) | Composition of surface insulating layer (% by vol.) | | | Strength (MPa) | α (ppm/° C.) |
|---|---|---|---|---|---|---|---|---|---|---|
| *1 | BT resin | 50 | spherical $SiO_2$ | 50 | 110 | 20 | BT resin | 50 | spherical $SiO_2$ | 50 | 110 | 20 |
| *2 | PPE | 50 | spherical $SiO_2$ | 50 | 105 | 20 | PPE | 50 | spherical $SiO_2$ | 50 | 105 | 20 |
| *3 | Polyimide | 50 | spherical $SiO_2$ | 50 | 125 | 20 | polyimide | 50 | spherical $SiO_2$ | 50 | 125 | 20 |
| *4 | BT resin | 50 | aramid nonwoven fabric | 50 | 450 | 10 | BT resin | 70 | spherical $SiO_2$ | 30 | 98 | 29 |
| *5 | BT resin | 50 | aramid nonwoven fabric | 50 | 450 | 10 | BT resin | 60 | spherical $SiO_2$ | 40 | 103 | 24 |
| 6 | BT resin | 50 | aramid nonwoven fabric | 50 | 450 | 10 | BT resin | 50 | spherical $SiO_2$ | 50 | 110 | 20 |
| 7 | BT resin | 50 | aramid nonwoven fabric | 50 | 450 | 10 | BT resin | 45 | spherical $SiO_2$ | 55 | 113 | 18 |
| 8 | BT resin | 50 | aramid nonwoven fabric | 50 | 450 | 10 | BT resin | 40 | spherical $SiO_2$ | 60 | 115 | 16 |

TABLE 4-continued

| | | | | | | | | | | | |
|---|---|---|---|---|---|---|---|---|---|---|---|
| 9 | BT resin | 50 | aramid nonwoven fabric | 50 | 450 | 10 | BT resin | 30 | spherical SiO₂ | 70 | 118 | 12 |
| 10 | BT resin | 50 | aramid nonwoven fabric | 50 | 450 | 10 | BT resin | 20 | spherical SiO₂ | 80 | 120 | 8 |
| 11 | BT resin | 50 | glass fabric | 50 | 465 | 14 | BT resin | 30 | spherical SiO₂ | 70 | 118 | 12 |
| *12 | BT resin | 60 | AlBO (W) | 40 | 305 | 26 | BT resin | 30 | spherical SiO₂ | 70 | 118 | 12 |
| 13 | BT resin | 50 | AlBO (W) | 50 | 400 | 22 | BT resin | 30 | spherical SiO₂ | 70 | 118 | 12 |
| 14 | BT resin | 40 | AlBO (W) | 60 | 460 | 18 | BT resin | 30 | spherical SiO₂ | 70 | 118 | 12 |

| Sample No. | Δα (Ppm/° C.) | Board breaking load (kgf) | Falling test degect number | Heat cycle defect number |
|---|---|---|---|---|
| *1 | 0 | 50 | 20/20 | 0/20 |
| *2 | 0 | 40 | 20/20 | 0/20 |
| *3 | 0 | 65 | 19/20 | 0/20 |
| *4 | 19 | 205 | 0/20 | 20/20 |
| *5 | 14 | 218 | 0/20 | 19/20 |
| 6 | 10 | 225 | 0/20 | 2/20 |
| 7 | 8 | 230 | 0/20 | 1/20 |
| 8 | 6 | 233 | 0/20 | 0/20 |
| 9 | 2 | 242 | 0/20 | 0/20 |
| 10 | 2 | 255 | 0/20 | 0/20 |
| 11 | 2 | 260 | 0/20 | 0/20 |
| *12 | 14 | 156 | 0/20 | 15/20 |
| 13 | 10 | 215 | 0/20 | 2/20 |
| 14 | 6 | 245 | 0/20 | 0/20 |

Samples marked with * lie outside the range of the invention.

TABLE 5

| Sample No. | Composition of highly strong insulating layer (% by vol.) | | | Strength (MPa) | α (ppm/° C.) | Composition of surface insulating layer (% by vol.) | | | Strength (MPa) | α (ppm/° C.) |
|---|---|---|---|---|---|---|---|---|---|---|
| 15 | BT resin | 50 | aramid nonwoven fabric | 50 | 450 | 10 | BT resin | 30 | spherical BaTiO₃ | 70 | 95 | 16 |
| 16 | BT resin | 50 | aramid nonwoven fabric | 50 | 450 | 10 | BT resin | 30 | spherical MgTiO₃ | 70 | 90 | 16 |
| 17 | BT resin | 50 | aramid nonwoven fabric | 50 | 450 | 10 | BT resin | 30 | spherical CaTiO₃ | 70 | 95 | 16 |
| 18 | PPE | 50 | aramid nonwoven fabric | 50 | 440 | 10 | BT resin | 30 | spherical SiO₂ | 70 | 115 | 12 |
| 19 | Polyimide | 50 | aramid nonwoven fabric | 50 | 460 | 10 | PPE | 30 | spherical SiO₂ | 70 | 120 | 12 |

| Sample No. | Δα (Ppm/° C.) | Board breaking load (kgf) | Falling test degect number | Heat cycle defect number |
|---|---|---|---|---|
| 15 | 6 | 203 | 0/20 | 0/20 |
| 16 | 6 | 201 | 0/20 | 0/20 |
| 17 | 6 | 204 | 0/20 | 0/20 |
| 18 | 2 | 235 | 0/20 | 0/20 |
| 19 | 2 | 246 | 0/20 | 0/20 |

In the samples Nos. 1 to 3 having insulating layers obtained by adding spherical silica to the organic resins as will be obvious from Tables 4 and 5, the board strengths are not larger than 125 MPa. In the falling test, most of the boards are damaged. Even when a highly strong insulating layer is provided, the insulating layer is peeled off during the heat cycle testing when the difference in the thermal expansion is larger than 10 ppm/° C., and stability is lost.

On the other hand, the multilayer wiring board of the present invention makes it possible to strikingly improve the board breaking strength, and exhibits favorable results even in the falling test. In the heat cycle testing, furthermore, the multilayer wiring board of the present invention suppresses the insulating layers from peeling and exhibits excellent stability.

Example 12

Figure 5:
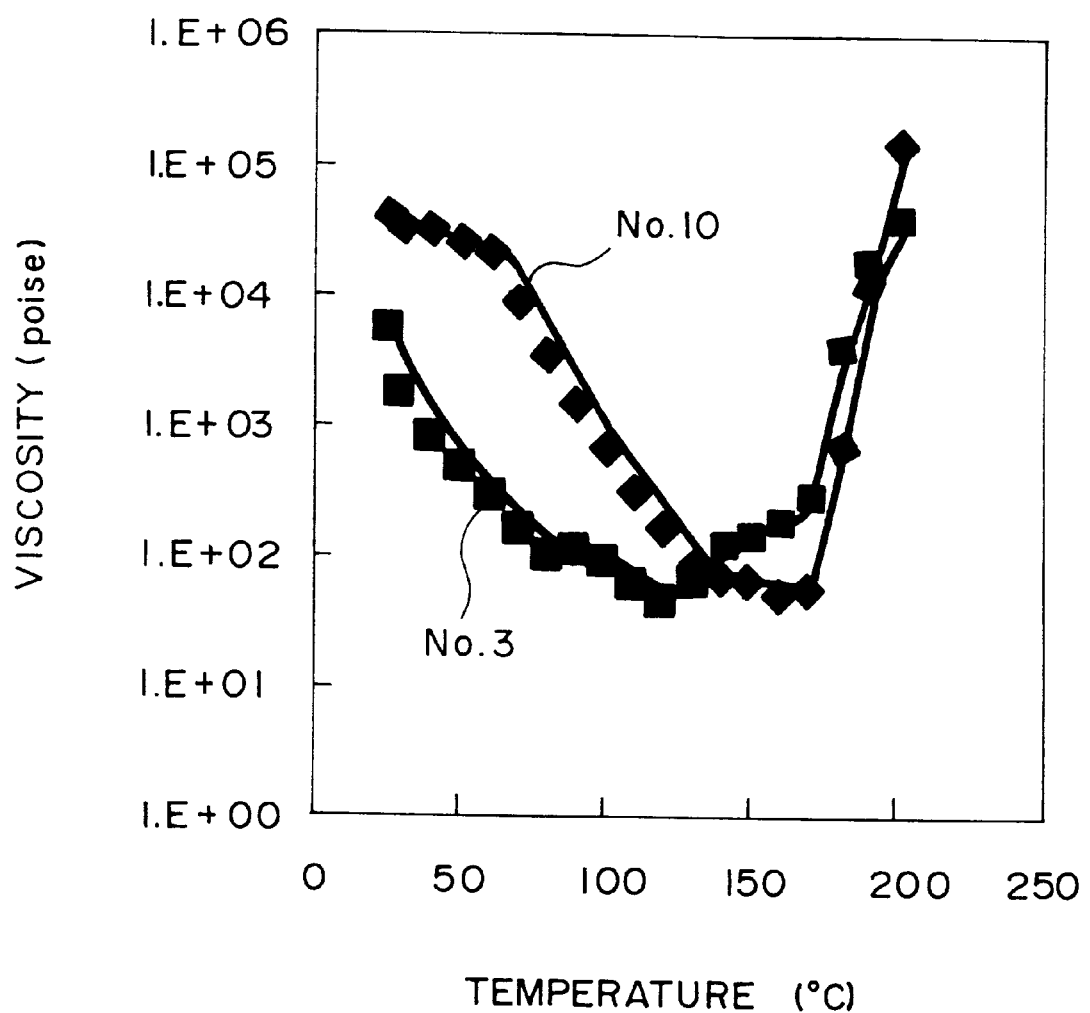
FIG. 5 is a diagram illustrating relationships between the temperature and the viscosities of the polyimide resins used for preparing samples Nos. 3 and 10 of Example 11.

To various polyimide resins having viscous characteristics as shown in Table 6 was added 60% by volume of an SiO₂ powder as a filler, and the mixtures were formed into insulating layers in the form of a 100 μm-thick sheet by the doctor blade method. FIG. 5 shows relationships between the temperature and the viscosities of the polyimide resins of samples Nos. 3 and 10.

The insulating layers were irradiated and scanned with a YAG laser beam of a diameter of 20 μm to form via holes of a diameter of 100 μm. The via holes were filled, by the screen-printing method, with a conducting paste prepared by mixing an Ag—Cu alloy powder having an average particle diameter of 5 μm, 1% by weight of an ethyl cellulose as a binder and 6% by weight of 2-octanol as a solvent.

A copper foil having a thickness of 12 μm was stuck onto a transfer sheet composed of a PET film, and a conducting circuit layer was formed by etching and was transferred onto the insulating layer by applying a pressure of 100 kg/cm². Then, four pieces of the insulating layers formed in the same manner were laminated one upon the other.

The thus prepared laminate was heat-treated at 120° C. for 3 hours in a nitrogen atmosphere to remove the solvent from the insulating layers and to remove the binder and the solvent from the via hole conducting passages. Then, the laminate was heated up to the curing temperature of the For the purpose of comparison, furthermore, the circuit board was prepared quite in the same manner as described above but completely curing the circuit board at 250°C. without applying pressure, and was evaluated in the same manner as described above.

TABLE 6

| Sample No. | Thermosetting resin of the insulating layer | | | Voids in via hole conducting passages after heat-treated at 120° C. | Pressure of resin in via hole conducting passages in the board | Filling rate of metal powder (%) | Resistivity ($\Omega \cdot$ cm) | Resistivity after heat-treated under hi-temp. hi-humidity conditions ($\Omega \cdot$ cm) | Remarks |
| --- | --- | --- | --- | --- | --- | --- | --- | --- | --- |
| | Viscosity at 100° C. or lower (poises) | Min. viscosity (poises) | Curing temp. (° C.) | | | | | | |
| *1 | ≧80 | 80 | 200 | filled with resin | filled with resin | 62 | $6.3 \times 10^{-4}$ | $5.1 \times 10^{-4}$ | |
| *2 | ≧90 | 90 | 200 | filled with resin | filled with resin | 65 | $4.1 \times 10^{-4}$ | $4.2 \times 10^{-4}$ | |
| *3 | ≧100 | 50 | 200 | filled with resin | filled with resin | 60 | $7.0 \times 10^{-4}$ | $6.7 \times 10^{-4}$ | |
| *4 | ≧200 | 95 | 200 | filled with resin | filled with resin | 60 | $7.2 \times 10^{-4}$ | $7.0 \times 10^{-4}$ | |
| 5 | ≧500 | 50 | 200 | voids exist | filled with resin | 74 | $7.5 \times 10^{-6}$ | $7.2 \times 10^{-6}$ | |
| 6 | ≧1230 | 90 | 250 | voids exist | filled with resin | 82 | $6.2 \times 10^{-6}$ | $5.9 \times 10^{-6}$ | |
| 7 | ≧1270 | 83 | 250 | voids exist | filled with resin | 71 | $8.3 \times 10^{-6}$ | $8.0 \times 10^{-6}$ | |
| 8 | ≧3000 | 98 | 270 | voids exist | filled with resin | 73 | $7.8 \times 10^{-6}$ | $7.7 \times 10^{-6}$ | |
| 9 | ≧800 | 90 | 250 | voids exist | filled with resin | 80 | $6.7 \times 10^{-6}$ | $6.8 \times 10^{-6}$ | |
| 10 | ≧1320 | 60 | 220 | voids exist | filled with resin | 68 | $9.1 \times 10^{-6}$ | $8.8 \times 10^{-6}$ | |
| 11 | ≧500 | 68 | 250 | voids exist | filled with resin | 78 | $7.1 \times 10^{-6}$ | $7.0 \times 10^{-6}$ | |
| 12 | ≧1260 | 92 | 250 | voids exist | filled with resin | 81 | $6.4 \times 10^{-6}$ | $6.3 \times 10^{-6}$ | |
| *13 | ≧1500 | 130 | 250 | voids exist | voids exist | 70 | $8.5 \times 10^{-6}$ | $3.7 \times 10^{-4}$ | |
| *14 | ≧800 | 90 | 250 | voids exist | voids exist | 62 | $5.5 \times 10^{-4}$ | $2.5 \times 10^{-3}$ | not pressurized |

Samples marked with * lie outside the range of the invention resins while applying a pressure of 70 kg/cm², and was maintained at the curing temperature for 2 hours to completely cure the thermosetting resin, thereby to obtain a circuit board.

After the heat treatment at 120° C. in the above-mentioned step, presence of voids among the metal particles in the via hole conducting passages was observed by an SEM photography. After completely cured at 250° C., furthermore, the via hole conducting passages were observed, and the presence of the resin in the voids among the metal particles was observed by way of SEM. The results were as shown in Table 6. The filling rate of the metal powder in the via hole conducting passages was also measured. The via hole conducting passages were observed in cross section by the SEM photography, and the area occupation rate of the metal powder in the center of the via hole conducting passages was found by the analysis of an image and was regarded to be the filling rate.

Furthermore, the resistivity of the via hole conducting passages after completely cured was measured by the four-terminal method. To measure the long-term stability of the via hole conducting passages, furthermore, the board was maintained in an atmosphere of a temperature of 85° C. and a humidity of 85% for 168 hours, and the resistivities of the via hole conducting passages were measured. The results were as shown in Table 6.

From Table 6, it is confirmed that when a thermosetting resin having predetermined viscous characteristics of the present invention is used, voids are formed among the metal particles in the via hole conducting passages after heated at 120° C. After finally cured by the heat treatment with the application of pressure, furthermore, the conducting metal particles come into firm contact, so that the filling rate of the metal powder reaches 65%. It was further confirmed that the voids among the metal particles are filled with the resin. As a result, the via hole conducting passages according to the present invention all exhibits initial resistivities which are not larger than $1 \times 10^{-5}$ $\Omega$-cm. Even after preserved for extended periods of time under high-temperature and high-humidity conditions, furthermore, the metal powder in the via hole conducting passages is not oxidized, and almost no change occurs in the resistance; i.e., the resistivities are smaller than $1 \times 10^{-5}$ $\Omega$-cm, and excellent long-term stability is maintained.

In the samples Nos. 1, 2, 3 and 4 which use organic resins having viscosities of smaller than 500 poises at not higher than 100° C. in the noncured insulating layers, as a thermosetting resin for constituting the insulating layers, on the other hand, the resins in the insulating layers ooze out into the via hole conducting passages after treated at 120° C. Even after the heat-treatment under the application of pressure, therefore, the filling rate of the metal powder is smaller than 65%. As a result, the via hole conducting passages exhibit large resistivities.

In the sample No. 13 having a minimum viscosity which is larger than 100 poises, the voids in the via hole conducting passages are not filled with the resin after the heat treatment with the application of pressure, the resistivity increases after the heat treatment in a high-temperature and high-humidity atmosphere, and both the initial resistivities of the via hole conducting passages and the resistivities after the treatment in the high-temperature and high-humidity atmosphere become greater than $3 \times 10^{-5}$ Ω-cm.

In the sample No. 14 that was not pressurized at the time of complete curing, the metal powder is filled at a small rate and, besides, voids remain in the via hole conducting passages. Therefore, the initial resistivities exceed $3 \times 10^{-5}$ Ω-cm, and the resistivities further increase through the treatment under high-temperature and high-humidity conditions.

What is claimed is:

1. A process for producing a multilayer wiring board comprising:

(A) forming a first wiring circuit layer on a first insulating board;

(B) laminating, on said first wiring circuit layer, a second soft insulating board having via hole conducting passages formed by filling via holes with a conducting paste; and (C) forming a second wiring circuit layer buried in a surface of the second insulating board by transferring thereon a conducting layer formed on a transfer sheet in a manner to close open portions of said via hole conducting passages, wherein in step (B) the thermosetting resin in the second insulating board is oozed out into the via hole conducting passages.

2. A process for producing a multi-layer wiring board comprising:

(a) forming a first wiring circuit layer on a first surface of a first insulating board;

(b) forming via hole conducting passages in a soft second insulating board containing a thermosetting resin by forming via holes, and filling said via holes with a conducting paste, the via hole conducting passages having first and second ends opening to a first and a second surface of the second insulating board, respectively;

(c) forming a second wiring circuit layer buried in the first surface of the second insulating board by transferring thereon a conducting layer formed on a transfer sheet in a manner to close the first end of said via hole conducting passages; and (d) laminating the second insulating board obtained in step (c) on the first surface of the first insulating board in a manner that the second end of said via hole conducting passages are closed by the first wiring circuit layer, wherein during the lamination in step (d), the thermosetting resin in the second insulating board is oozed out into the via hole conducting passages.

3. A process for producing a multilayer wiring board comprising:

(A) forming a first wiring circuit layer on a first insulating board;

(B) laminating on said first wiring circuit layer, a second soft insulating board having via hole conducting passages formed by filling via holes with a conducting paste obtained by dispersing metal particles in a binder composed of a thermosetting resin; and (C) forming a second wiring circuit layer buried in a surface of the second insulating board by transferring thereon a conducting layer formed on a transfer sheet in a manner to close open portions of said via hole conducting passages, wherein after said second wiring circuit layer is formed, a pulse current is supplied into the via hole conducting passages in the second insulating board, so that the metal particles are weld-joined in the conducting paste and that said metal particles are weld-joined to the second wiring circuit layer.

4. A process for producing a multilayer wiring board according to claim 3, wherein said pulse current is a direct current of a rectangular wave form.

5. A process for producing a multilayer wiring board according to claim 3, wherein said pulse current has a current density of 1 to 2000 A/cm².

6. A process for producing a multi-layer wiring board comprising:

(a) forming a first wiring circuit layer on a first surface of a first insulating board;

(b) forming via hole conducting passages in a soft second insulating board containing a thermosetting resin by forming via holes, and filling said via holes with a conducting paste obtained by dispersing metal particles in a binder composed of a thermosetting resin, the via hole conducting passages having first and second ends opening to a first and a second surface of the second insulating board, respectively;

(c) forming a second wiring circuit layer buried in the first surface of the second insulating board by transferring thereon a conducting layer formed on a transfer sheet in a manner to close the first end of said via hole conducting passages; and (d) laminating the second insulating board obtained in step (c) on the first surface of the first insulating board in a manner that the second end of said via hole conducting passages are closed by the first wiring circuit layer, wherein after said second wiring circuit layer is formed, a pulse current is supplied into the via hole conducting passages in the second insulating board, so that the metal particles are weld-joined in the conducting paste and that said metal particles are weld-joined to the second wiring circuit layer.

7. A process for producing a multilayer wiring board according to claim 6, wherein said pulse current is a direct current of a rectangular wave form.

8. A process for producing a multilayer wiring board according to claim 6, wherein said pulse current has a current density of 1 to 2000 A/cm² over an area of the second insulating board.

* * * * *